US012571747B2

(12) United States Patent
Yang et al.

(10) Patent No.: US 12,571,747 B2
(45) Date of Patent: Mar. 10, 2026

(54) OVERLAY MEASURING METHOD

(71) Applicant: SAMSUNG ELECTRONICS CO., LTD., Suwon-si (KR)

(72) Inventors: Wonjun Yang, Suwon-si (KR); Sangho Yun, Suwon-si (KR); Woojin Jung, Suwon-si (KR); Minsu Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 407 days.

(21) Appl. No.: 18/228,741

(22) Filed: Aug. 1, 2023

(65) Prior Publication Data

US 2024/0060916 A1     Feb. 22, 2024

(51) Int. Cl.
  *G03F 9/00*        (2006.01)
  *G01N 23/2251*     (2018.01)
  *G06T 7/30*        (2017.01)

(52) U.S. Cl.
  CPC ...  *G01N 23/2251* (2013.01); *G01N 2223/401* (2013.01); *G01N 2223/6116* (2013.01); *G03F 9/7088* (2013.01); *G06T 7/30* (2017.01)

(58) Field of Classification Search
  CPC ......... G01N 23/2251; G01N 2223/401; G01N 2223/6116; G01N 2223/418; G03F 7/70633; G03F 7/70616; G03F 9/7088; G06T 7/30
  See application file for complete search history.

(56) References Cited

U.S. PATENT DOCUMENTS

| | | | |
|---|---|---|---|
| 7,415,319 B2 | 8/2008 | Werkman et al. | |
| 8,804,137 B2* | 8/2014 | Choi ..................... | H01L 23/544 |
| | | | 356/620 |
| 9,874,527 B2 | 1/2018 | Amit et al. | |
| 9,934,939 B2 | 4/2018 | Kim et al. | |
| 10,415,963 B2 | 9/2019 | Marciano et al. | |
| 10,571,811 B2 | 2/2020 | Amit et al. | |
| 2013/0293890 A1* | 11/2013 | Amir .................. | G03F 7/70633 |
| | | | 356/401 |
| 2016/0013109 A1* | 1/2016 | Yun ........................ | H01J 37/222 |
| | | | 250/307 |
| 2021/0384086 A1* | 12/2021 | Van Leest .......... | G03F 7/70633 |
| 2022/0035258 A1 | 2/2022 | Lee et al. | |

* cited by examiner

*Primary Examiner* — Siamak Harandi
(74) *Attorney, Agent, or Firm* — Muir Patent Law, PLLC

(57)        ABSTRACT

Provided is an overlay measuring method including setting an overlay offset on a substrate, obtaining a cell image by irradiating an electron beam, and obtaining a first image of an upper pattern and a second image of a lower pattern, based on the cell image, merging the first image with the second image, and measuring an overlay of the merged image, and correcting a measuring parameter used in measuring the overlay to improve consistency between the overlay offset and a measured result value of the overlay, wherein the measuring parameter is corrected based on a number of measuring failure values classified as a measurement failure in result values of the overlay.

20 Claims, 27 Drawing Sheets

FIG. 4

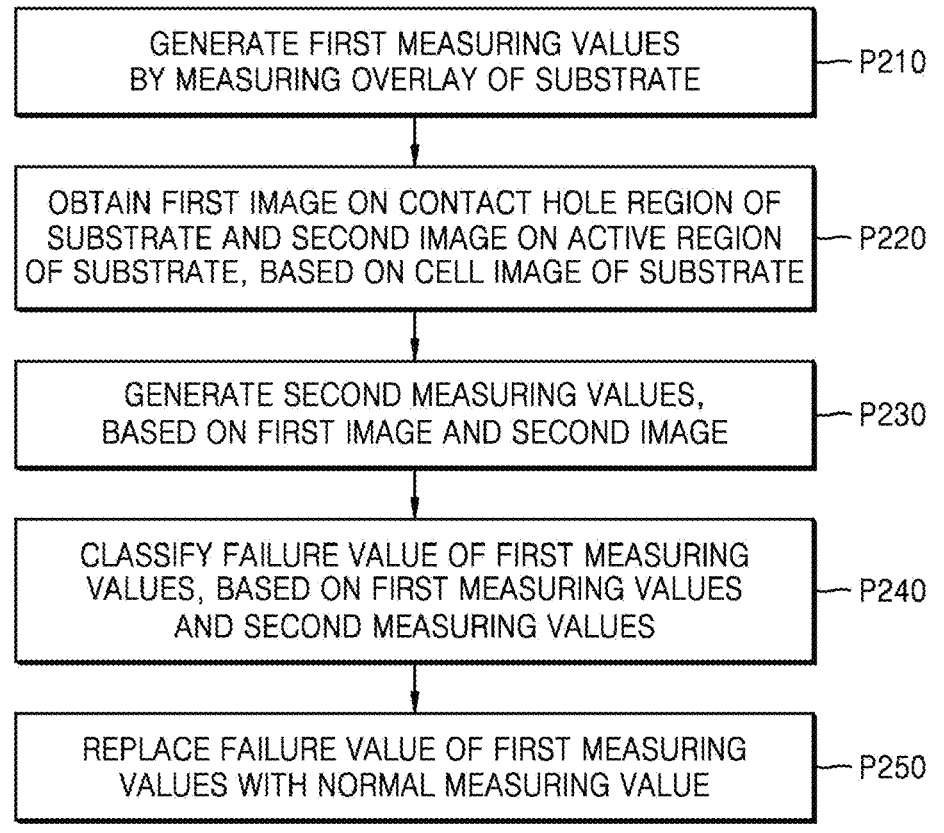

GENERATE FIRST MEASURING VALUES
BY MEASURING OVERLAY OF SUBSTRATE — P210

OBTAIN FIRST IMAGE ON CONTACT HOLE REGION OF
SUBSTRATE AND SECOND IMAGE ON ACTIVE REGION
OF SUBSTRATE, BASED ON CELL IMAGE OF SUBSTRATE — P220

GENERATE SECOND MEASURING VALUES,
BASED ON FIRST IMAGE AND SECOND IMAGE — P230

CLASSIFY FAILURE VALUE OF FIRST MEASURING
VALUES, BASED ON FIRST MEASURING VALUES
AND SECOND MEASURING VALUES — P240

REPLACE FAILURE VALUE OF FIRST MEASURING
VALUES WITH NORMAL MEASURING VALUE — P250

SECOND
DIRECTION

FIRST DIRECTION

THIRD DIRECTION

SECOND
DIRECTION

FIRST DIRECTION

THIRD DIRECTION

SECOND
DIRECTION

FIRST DIRECTION

THIRD DIRECTION

SECOND
DIRECTION

FIRST DIRECTION
THIRD DIRECTION

SECOND
DIRECTION

FIRST DIRECTION

THIRD DIRECTION

OVERLAY MEASURING METHOD

CROSS-REFERENCE TO RELATED APPLICATION

This application is based on and claims priority under 35 U.S.C. § 119 to Korean Patent Application No. 10-2022-0102227, filed on Aug. 16, 2022, in the Korean Intellectual Property Office, the disclosure of which is incorporated by reference herein in its entirety.

BACKGROUND

1. Field

Embodiments relate to an overlay measuring method.

2. Description of the Related Art

Recently, as a photo overlay margin is reduced due to a reduction in design rules for semiconductor products, an overlay measurement technique between major upper and lower patterns has become more important. In addition, a measurement method using an overlay-only key in a scribe line in the related art reached a limit in representing a pattern in a cell. While a technique for measuring an overlay between actual patterns in a cell has been actively developed, the precision of the overlay may be reduced due to a double patterning technology (DPT), a quadruple patterning technology (QPT) process, or dispersion within a cell.

SUMMARY

According to an aspect of embodiments, there is provided an overlay measuring method including setting an overlay offset on a substrate, obtaining a cell image by irradiating an electron beam, and obtaining a first image of an upper pattern and a second image of a lower pattern, based on the cell image, merging the first image with the second image, and measuring an overlay of the merged image, and correcting a measuring parameter used in measuring the overlay to improve consistency between the overlay offset and a measured result value of the overlay, wherein the measuring parameter is corrected based on a number of measuring failure values classified as a measurement failure in result values of the overlay.

According to another aspect of embodiments, there is provided an overlay measuring method including generating first measuring values by measuring an overlay of a substrate, obtaining a first image of a contact hole region of the substrate and a second image of an active region of the substrate, based on a cell image of the substrate, generating second measuring values based on the first image and the second image, classifying a failure value of the first measuring values, based on the first measuring values and the second measuring values, and replacing the failure value of the first measuring values with a normal measuring value.

According to yet another aspect of embodiments, there is provided an overlay measuring method including forming a photoresist pattern on a substrate having an upper surface extending in first and second directions, measuring an overlay of the substrate, correcting a measuring parameter used in measuring the overlay by comparing and analyzing the measured overlay with a preset overlay offset, classifying a failure value of a result value of the overlay, based on the result value of the overlay and the preset overlay offset, re-measuring an overlay of the substrate by using the corrected measuring parameter, and replacing the failure value with a result value of the re-measured overlay.

BRIEF DESCRIPTION OF THE DRAWINGS

Features will become apparent to those of skill in the art by describing in detail exemplary embodiments with reference to the attached drawings, in which:

FIG. 4 is a flowchart illustrating an overlay measuring method according to another embodiment;

FIG. 6 is a graph illustrating an overlay measuring result obtained by changing measuring parameter, according to an embodiment;

DETAILED DESCRIPTION

Figure 1:
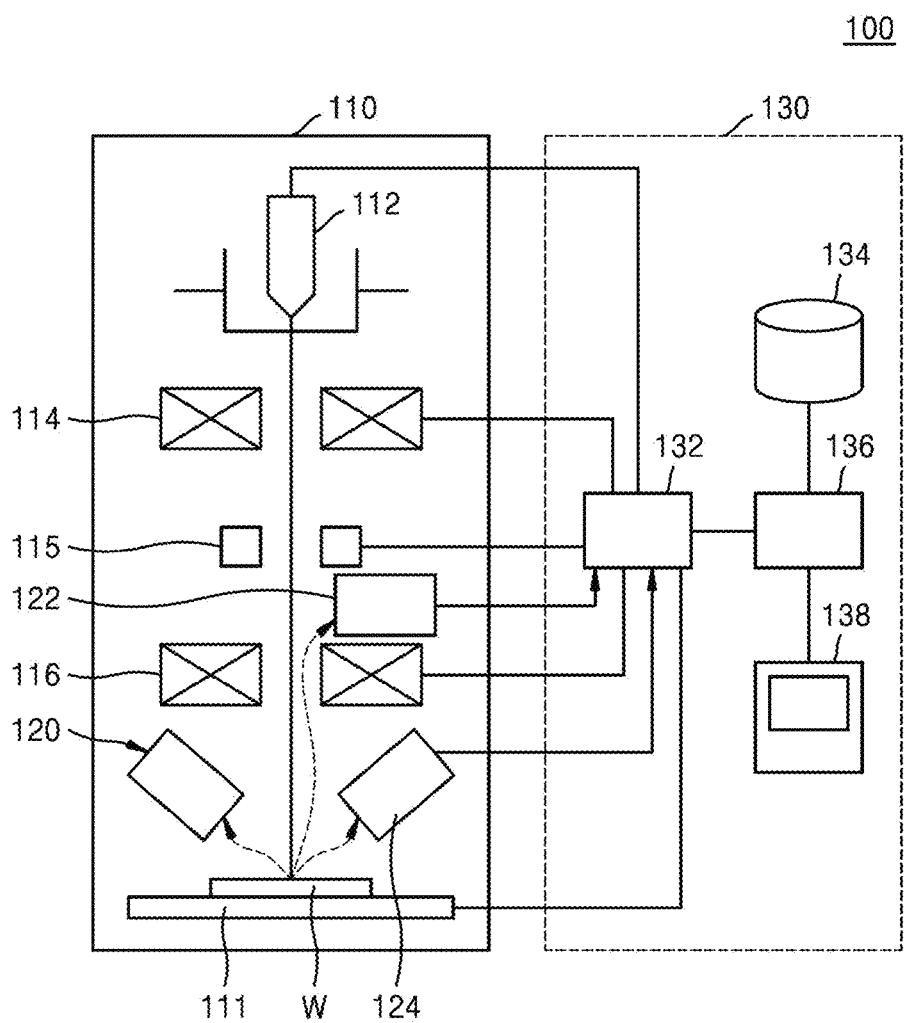
FIG. 1 is a block diagram illustrating an overlay measuring system according to an embodiment.

FIG. 1 is a block diagram illustrating an overlay measuring system 100 according to an embodiment.

Referring to FIG. 1, the overlay measuring system 100 may include an electro-optical system 110 and a processor 130. In the overlay measuring system 100, the electro-optical system 110 irradiates an electron beam on a substrate, e.g., a semiconductor substrate on which a multi-layered structure is formed, and detects emitted electrons, and the processor 130 is configured to calculate an overlay between an upper layer (e.g., patterns) and a lower layer (e.g., patterns) of the multi-layered structure by obtaining and analyzing an image from the electrons detected by the electro-optical system 110.

In embodiments, the overlay measuring system 100 may be used in a semiconductor manufacturing operation for manufacturing semiconductor devices, e.g., dynamic random access memory (DRAM), vertical NAND (VNAND), or the like, to measure an overlay between a previously patterned first layer and a currently patterned second layer in a non-destructive manner.

As shown in FIG. 1, the electro-optical system 110 of the overlay measuring system 100 may include a scanning electro-optical microscope (SEM) for capturing an image of a substrate W having a multi-layered structure. For example, the electro-optical system 110 may be a high-acceleration SEM. The electro-optical system 110 may include a microscope stage 111 that supports the substrate W, an electron gun 112 for generating a primary electron beam, a focusing lens 114 for controlling the direction and width of the primary electron beam and irradiating the primary electron beam on the substrate W, a deflector 115, an objective lens 116, and a detector 120 for detecting a detection signal, e.g., electrons emitted from the substrate W.

The processor 130 may control the overall operation of the overlay measuring system 100. The processor 130 may execute an operating system, an application, or the like. The processor 130 may perform a function of a central processing unit (CPU). For example, the processor 130 may control operations of an image obtaining unit 132, an image processing unit 136, a data storage unit 134, and an output unit 138.

Figure 2:
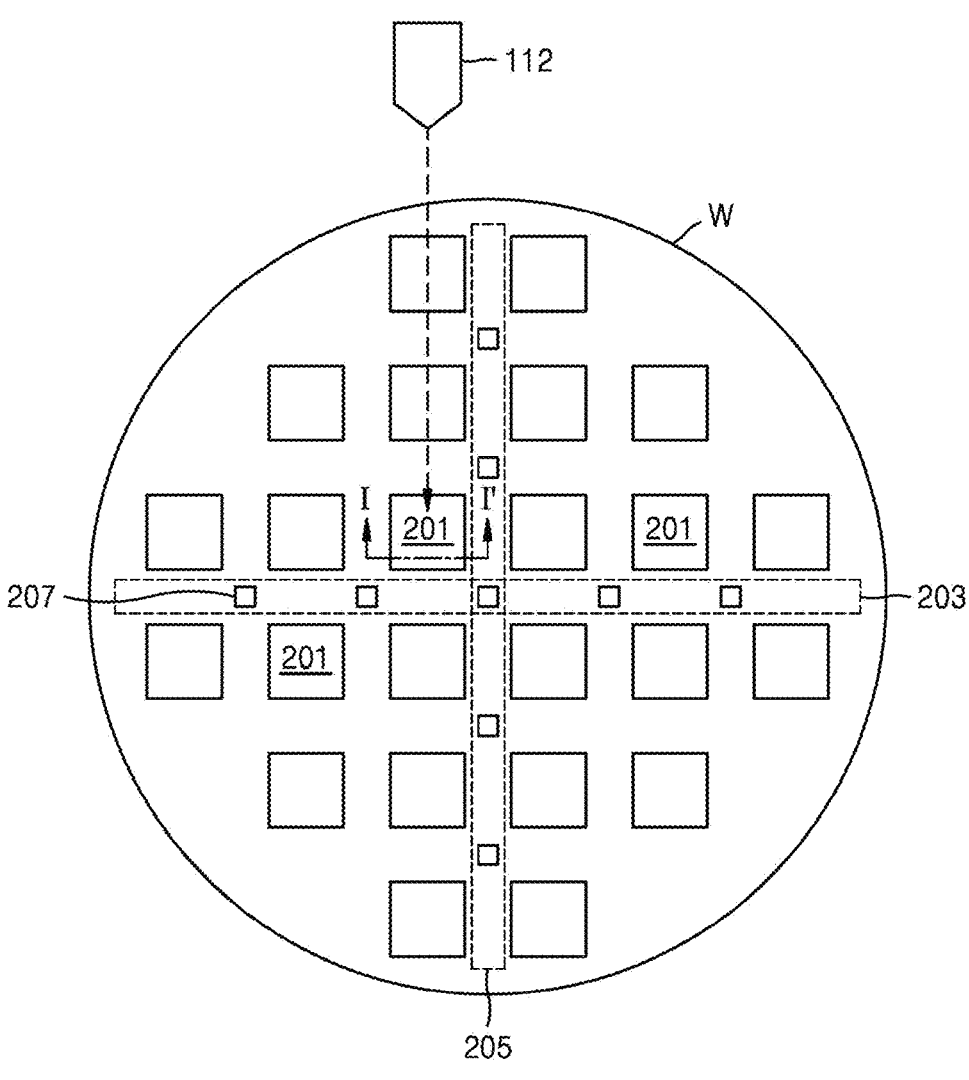
FIG. 2 is a plan view of a substrate on which a multi-layered structure is formed, according to an embodiment.

FIG. 2 is a plan view of the substrate W on which a multi-layered structure is formed, according to an embodiment. The substrate W may be a semiconductor wafer on which a multi-layered structure is formed.

Referring to FIG. 2, the substrate W may be a semiconductor wafer including a plurality of chips 201. According to some embodiments, a memory device may be formed in each of the plurality of chips 201. According to some embodiments, a non-volatile memory device may be formed in each of the plurality of chips 201. According to some embodiments, the non-volatile memory device may be a non-volatile NAND-type flash memory. According to some embodiment, the non-volatile memory device may be any one of, e.g., a phase-change random access memory (PRAM), a magneto-resistive random access memory (MRAM), a resistive random access memory (ReRAM), a ferroelectric random access memory (FRAM), and a NOR flash memory. According to some embodiments, a volatile memory device in which data is lost when power is cut off, e.g., a DRAM and a static random access memory (SRAM), may be formed in each of the plurality of chips 201. According to some embodiments, any one of, e.g., a logic chip, a measuring device, a communication device, a digital signal processor (DSP), and a system-on-chip (SoC) may also be formed in each of the plurality of chips 201.

For example, as illustrated in FIG. 2, each of the plurality of chips 201 may have an approximate quadrangular profile, e.g., a square shape in a top view. For example, the plurality of chips 201 may each be a driving integrated circuit (IC) chip. In this case, a pair of edges of each of the plurality of chips 201 may be longer than the other pair of edges thereof.

As illustrated in FIG. 2, the substrate W may include the plurality of chips 201, a plurality of horizontal scribe lines 203, a plurality of vertical scribe lines 205, and a plurality of alignment marks 207. In addition, the substrate W may have at least one multi-layered structure in which upper and lower structures, e.g., patterns or layers, overlapping each other are respectively formed. The upper and lower structures, e.g., patterns or layers, may each include, e.g., a photoresist, a dielectric material, and a conductive material.

Referring to FIGS. 1 and 2, the electron gun 112 of the overlay measuring system 100 may scan, e.g., irradiate, an electron beam into an in-cell region of the substrate W having a multi-layered structure. Here, the in-cell region refers to the chip 201, e.g., a region in the chip 201 in which actual electronic components or actual patterns are implemented. Accordingly, the in-cell region refers to a region that is isolated from the respective horizontal and vertical scribe lines 203 and 205 and does not include the alignment mark 207.

In embodiments, the depth at which the electron beam penetrates the substrate W may be adjusted by adjusting an acceleration voltage of the electron beam formed by the electron gun 112 to a low voltage or a high voltage. For example, the electron gun 112 may generate an electron beam having an acceleration voltage of about 10 kV or more.

As the acceleration voltage of the electron beam increases, the depth to which the electron beam penetrates into the substrate W increases. Accordingly, an amount of electrons emitted from a lower portion of the substrate W (e.g., from a lower layer) increases (e.g., in accordance with the adjusted increased depth), so electrons having lower structure information (e.g., from the lower layer) may be detected.

Accordingly, when an electron beam having a high landing energy of about 10 kV or more is irradiated onto the substrate W, a backscattered electron, an auger electron, or the like may be emitted from the substrate W together with a secondary electron.

Referring back to FIG. 1, the electro-optical system 110 may include the detector 120 for detecting electrons emitted from the substrate W. The detector 120 may include a first detector 122 that mainly detects secondary electrons, and a second detector 124 that mainly detects backscattered electrons. For example, the first detector 122 may include an in-lens detector that detects secondary electrons having upper structure information of the substrate W. The second detector 124 may include a detector arranged adjacent to the objective lens 116 that mainly detects backscattered electrons having lower structure information. The detected electrons may be used to generate an actual image of the substrate W, as will be described below.

Accordingly, the backscattered electrons as well as the secondary electrons may be detected by using a high-acceleration electron beam, thereby obtaining cell image showing the upper and lower structures, e.g., patterns or layers, at the same time. That is, an actual image showing a structure of a lower layer and a structure of an upper layer of the multi-layered structure may be obtained. For example, an actual image showing a hole pattern, e.g., a contact hole having a high aspect ratio, and an actual image showing an active region corresponding to a lower structure of the hole pattern may be obtained.

The overlay measuring system 100 may include the image obtaining unit 132 that receives a detection signal from the detector 120 and forms an image. The image obtaining unit 132 may obtain a cell image simultaneously showing the upper and lower structures of the substrate W by receiving detection signals from the first and second detectors 122 and 124. In addition, the image obtaining unit 132 may be operatively connected to various components of the electro-optical system 110 including the electron gun 112, the focusing lens 114, the deflector 115, the objective lens 116, and the microscope stage 111 and control operations thereof.

The processor 130 may control the electro-optical system 110 so that the image obtaining unit 132 obtains information on the upper and lower structures of the substrate W. For example, the image obtaining unit 132 controls the acceleration voltage (high voltage, low voltage) of the electron gun 112, and the electro-optical system 110 change the depths at which the electron beam penetrates the substrate W having a multi-layered structure by irradiating an electron beam having the controlled acceleration voltage Thus, electrons showing information of each layer of the multi-layered structure of the substrate W may be detected. The image obtaining unit 132 may obtain a cell image from the detected electrons.

In embodiments, the image obtaining unit 132 may divide the obtained cell image into sub-images showing different layers. For example, the cell image may be divided into a first image showing an upper layer and a second image showing a lower layer by respectively selecting particular gray level distributions. The gray level may be selected considering the thicknesses and materials of the upper and lower layers, the amount of detected electrons, or the like. In addition, the cell image, the first image, and the second image may be selectively stored in the data storage unit 134.

The image processing unit 136 may receive data of the first and second images from the data storage unit 134. Alternatively, the image processing unit 136 may directly receive the first and second images from the image obtaining unit 132.

In embodiments, the image processing unit 136 may calculate representative positions of the upper and lower layers, e.g., patterns, from the first and second images, respectively, and may calculate a deviation of representative positions of the second image with respect to the first image. The image processing unit 136 may calculate a representative position of the first image (the upper layer) and a representative position of the second image (the lower layer). For example, the image processing unit 136 may calculate a center position of the upper layer from the first image and calculate a center position of the lower layer from the second image.

The image processing unit 136 may calculate an overlay (for example, the overlap offset between a center position of the first image and a center position of the second image) of the second image (the lower layer) with respect to the first image (the upper layer) by matching the first image to the second image (for example, matching a center position of the first image to a center position of the second image). For example, the first and second images may be matched to each other by using, e.g., image edge matching, image contrast matching, or the like.

The image processing unit 136 may be operatively connected to the output unit 138. Overlay result values and images from the image processing unit 136 may be transmitted to the output unit 138. The output unit 138 may output the overlay result values on a display device.

At least one of the image obtaining unit 132, the image processing unit 136, the data storage unit 134, and the output unit 138 shown in FIG. 1 may be implemented by a single computer or the processor 130, or may be implemented as a separate module using a data transmission or interfacing unit. In addition, the image obtaining unit 132, the image processing unit 136, and the output unit 138 may be combined as some of controllers of a semiconductor manufacturing line.

Figure 3:
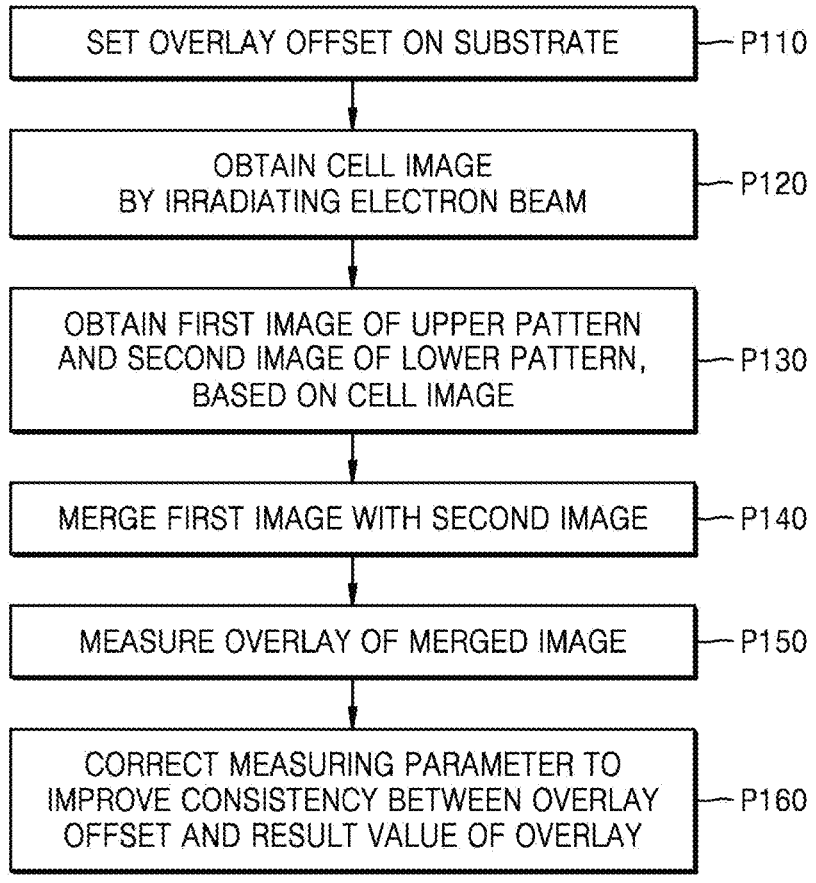
FIG. 3 is a flowchart illustrating an overlay measuring method according to an embodiment.

FIG. 3 is a flowchart illustrating an overlay measuring method according to an embodiment.

Referring to FIG. 3, in operation P110, the overlay measuring method of the embodiment sets an overlay offset on a substrate. The overlay offset may be an overlay error arbitrarily set for the substrate. The substrate may be a multi-layered structure having a lower layer, e.g., pattern, formed by a first semiconductor process and an upper layer, e.g., pattern, formed by a second semiconductor process. An overlay may be defined as matching the shapes of shots, e.g., images, to each other of a wafer or a semiconductor substrate in sequential operations, e.g., a current operation and a previous operation. The relative position control between layers, e.g., in the images, is referred to as overlay control, and overlay measurement may be performed for such overlay control. The overlay measurement means measuring the degree of misalignment between layers, overlay misalignment, or an overlay error.

Figure 8:
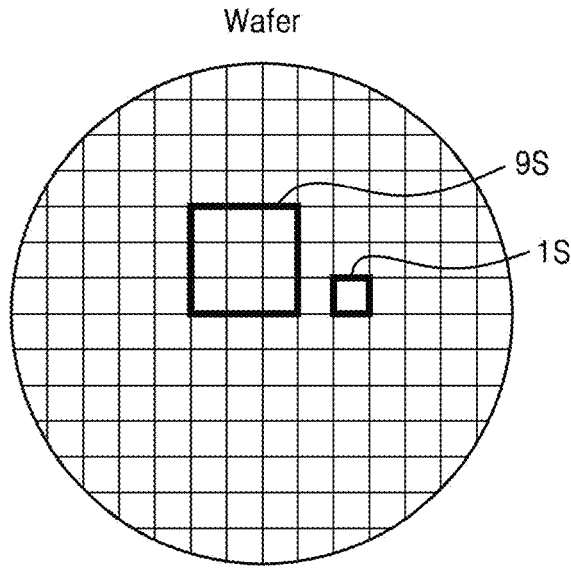
FIG. 8 is a diagram illustrating a plurality of adjacent shots in a substrate, according to embodiments.
Figure 9:
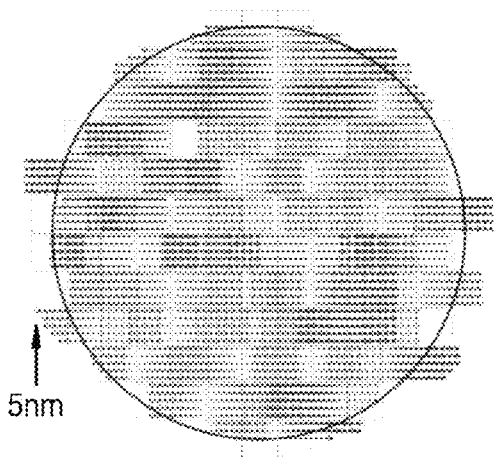
FIG. 9 is a diagram illustrating a method of setting an overlay offset, according to embodiments.

FIG. 8 is a diagram illustrating a plurality of adjacent shots in a substrate, according to embodiments. FIG. 9 is a diagram illustrating a method of setting an overlay offset, according to embodiments. In detail, FIG. 9 illustrates a substrate generated by an offset setting method that does not pollute a correlation coefficient of an overlay offset and a result value of the overlay (e.g., with respect to a slope of the overlay result value with respect to the overlay offset). The offset setting method is described in detail below.

Referring to FIGS. 3 and 9, the overlay offset may be set based on process window qualification (PWQ). Here, the PWQ may be an inspection method performed on a substrate manufactured in an essential particular method. The PWQ may be performed to confirm that a particular chip design is manufactured or to set an optimal parameter for a lithography process (e.g., an exposure energy dose and a focus depth).

Referring to FIG. 9, the overlay offset may include a plurality of overlay values (or overlay offset values or offset values) obtained by dividing a value in a range twice a reference offset by 10. Here, the reference offset may be an optimal range of an overlay or an overlay specification. The overlay specification means an overlay value required for a semiconductor device. For example, the plurality of overlay values may include overlay values ranging from −5 nm to +5 nm. The plurality of overlay values may be divided by an interval of 1 nm.

In embodiments, the plurality of overlay values may be −5 nm, −4 nm, −3 nm . . . 3 nm, 4 nm, and 5 nm. The plurality of overlay values may be set for each shot, e.g., image, in a substrate. For example, a first shot may be set to have an overlay of 1 nm, a second shot may be set to have an overlay of 3 mm, and a third shot may be set to have an overlay of −1 nm.

The overlay offset may be evenly set for a plurality of shots within six inches of a substrate. Here, an overlay offset may be set for each of a plurality of shots within six inches of the substrate. Any one shot of the plurality of shots may have a first overlay offset, and the other one of the plurality of shots may have a second overlay offset. Also, another one of the plurality of shots may have a third overlay offset. Here, the fact that the overlay offset is evenly set for the plurality of shots means that the number of shots to which the first overlay offset is set, the number of shots to which the second overlay offset is set, and the number of shots to which the third overlay offset is set are the same within six inches of the substrate.

That is, the plurality of shots positioned within six inches of the substrate mean that the same number of shots are arranged for each of different overlay offset values. Also, in the plurality of shots, the number of shots set as a first offset, which is one of the plurality of overlay values, may be the same as the number of shots set as a second offset, which is the other one of the plurality of overlay values.

In particular, the plurality of overlay values may be evenly distributed to each of the shots. For example, when there are 100 shots in a substrate, 10 first shots in which an overlay offset of 1 nm is set, 10 second shots in which an overlay offset of 3 nm is set, and 10 third shots in which an overlay offset of −1 nm is set may be arranged.

A minimum distance between a shot set to any one of the plurality of overlay values and a shot to which the same overlay offset is set may be 1.5 inches. The minimum distance means a straight-line distance between shots. For example, when an overlay offset of 3 nm is set for the first shot and an overlay offset of 3 nm is set for a second shot in a substrate, the first shot and the second shot may be arranged to be spaced apart from each other by 1.5 inches or more.

Referring to FIGS. 3 and 8, for the overlay offset, a sum of all overlay offsets set in nine adjacent shots 9S may be any one of values of −1 nm to 1 nm. The nine adjacent shots 9S may include nine shots arranged adjacent to each other in the substrate. The nine adjacent shots 9S may have a square shape as shown in FIG. 8.

In embodiments, the sum of the overlay offsets set in each of the nine adjacent shots 9S may be −1 nm. In embodiments, the sum of the overlay offsets set in each of the nine adjacent shots 9S may be 0 nm. In embodiments, the sum of the overlay offsets set in each of the nine adjacent shots 9S may be 1 nm. In embodiments, the sum of the overlay offsets set in each of the nine adjacent shots 9S may be −0.5 nm. The substrate may have a scale component of 0.3 nm or less. The scale component may be one variable that determines the overlay on the substrate.

By setting the overlay offset on the substrate through the above operation, a substrate that does not contaminate the slope (e.g., a correlation coefficient between the overlay offset and the overlay result with minimized outliers) may be manufactured even in the absence of misreading correction (MRC) at the beginning of the operation.

Referring to FIGS. 1 and 3, in operation P120, a cell image is obtained by irradiating an electron beam. The cell image refers to an image obtained through the image obtaining unit 132. The cell image may be an SEM image of a multi-layered structure. The cell image may be an image showing an upper layer (e.g., pattern) and a lower layer (e.g., pattern) at the same time. For example, an actual image showing a hole pattern, e.g., a contact hole having a high aspect ratio, and an actual image showing an active region corresponding to a lower structure of the hole pattern may be obtained.

In operation P130, a first image for an upper layer (e.g., pattern) and a second image for a lower layer (e.g., pattern) are obtained based on the cell image. The first image and the second image may be obtained by dividing the cell image by the image obtaining unit 132. The first image and the second image may be selected considering materials respectively configuring the upper layer (e.g., pattern) and the lower layer (e.g., pattern), an amount of detected electrons, or the like. For example, the upper layer (e.g., pattern) may correspond to a contact hole formed in an upper structure by a second semiconductor operation. For example, the lower layer (e.g., pattern) may correspond to the active region formed in a lower structure by a first semiconductor operation. For example, the upper layer may be any one of a first contact hole 375 (refer to FIG. 14B), a bit line 422 (refer to FIG. 16B), and landing pads 472 (refer to FIG. 19B).

In operation P140, the first image is merged, e.g., combined or superimposed, with the second image. Next, in operation P150, an overlay of the merged image is measured. The overlay of the merged image refers to a degree to which the lower layer is misaligned with respect to the upper layer or the degree to which the upper layer is misaligned with respect to the lower layer.

Figure 6:
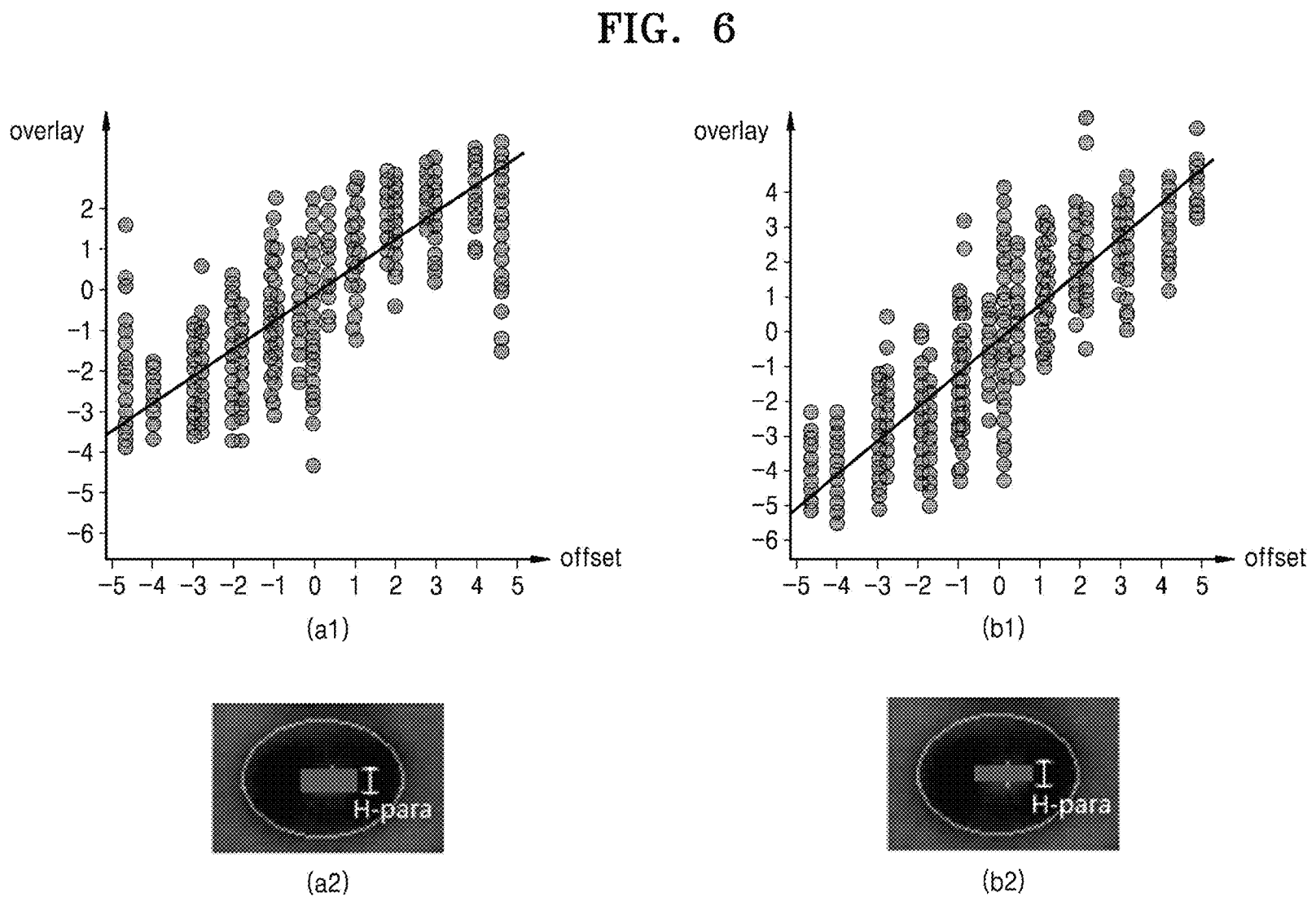

FIG. 6 is a graph illustrating an overlay measuring result obtained by changing a measuring parameter, according to an embodiment. The horizontal axis of the graph indicates an overlay offset, and the vertical axis thereof indicates a result value of the overlay, and each unit may be nm.

Referring to FIGS. 3 and 6, in operation P160, a measuring parameter is corrected to improve consistency between an overlay offset and a result value of the overlay. The measuring parameter may be any one of a critical dimension (CD) box parameter, a measurement box, and a contour parameter. The measuring parameter may correspond to H-para shown in (a2) and (b2) of FIG. 6. The measuring parameter may be one of variables for a measuring range for measuring an overlay. A particular correction method for a measuring parameter is described below.

Figure 5:
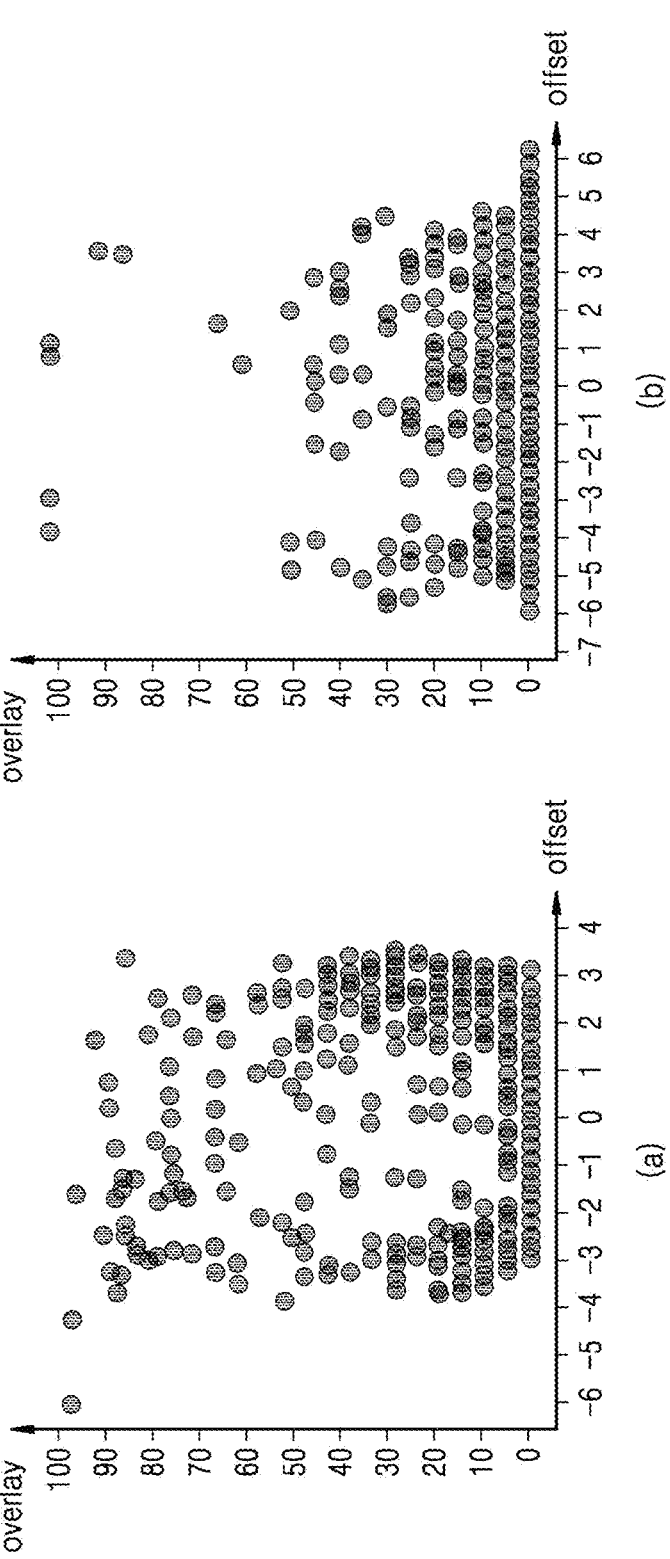
FIG. 5 illustrates graphs showing overlay measuring result obtained by changing measuring parameter, according to an embodiment.

FIG. 5 illustrates graphs showing overlay measuring result obtained by changing measuring parameter, according to an embodiment.

Referring to FIG. 5, the horizontal axis of the graph indicates an overlay offset, and the vertical axis thereof indicates a result value of the overlay, and each unit may be nm. The left side (a) is a graph of results of measuring an overlay by using a measuring parameter before correction, and the right side (b) is a graph of results of measuring an overlay by using a measuring parameter after correction.

In embodiments, the measuring parameter may be corrected based on the number of measuring failure values classified as measurement failures in the result values of the overlay. In embodiments, the measuring parameter may be corrected in a direction in which the number of measuring failure values is reduced in the result values of the overlay. In embodiments, a method of correcting a measuring parameter may be performed by a regression analysis method.

Referring to (a) of FIG. 5, result values of an overlay appearing during measurement using a measuring parameter before correction (H-para in (a2) of FIG. 6) are shown. Referring to (b) of FIG. 5, result values of an overlay appearing during measurement using a measuring parameter after correction (H-para in (b2) of FIG. 6) are shown. In (a) and (b) of FIG. 5, the result values of the overlay are displayed as absolute values. In the graph of (b) of FIG. 5, the result values of the overlay, which appear as measuring failure values, were significantly reduced, and the measuring parameter after correction (H-para of (b2) of FIG. 6) may be determined as a suitable measuring parameter.

In embodiments, the measuring failure value may be a case in which the result value of the overlay is −5 nm or less or 5 nm or more. In embodiments, the measuring failure value may be a case in which the result value of the overlay is −6 nm or less or 6 nm or more. In another embodiment, the measuring failure value may be a case in which the result value of the overlay is −10 nm or less or 10 nm or more.

Referring to FIGS. 3 and 6, in embodiments, the measuring parameter may be performed based on a correlation coefficient between the overlay offset and a result value of the overlay. In particular, the measuring parameter may be corrected such that the correlation coefficient approximates one. In embodiments, the correction of the measuring parameter may be performed based on the correlation coefficient and the number of measuring failure values classified as the measuring failure.

In embodiments, the correlation coefficient between the overlay offset and the result value of the overlay may have a value within the range of 0.60 to 0.70 before correction, and the correlation coefficient may have a value within a range of 0.80 to 1 after correction. In embodiments, the correlation coefficient between the overlay offset and the result value of the overlay may have a value within the range of 0.63 to 0.67 before correction, and the correlation coefficient may have a value within a range of 0.83 to 0.97 after correction.

Referring to (a1) of FIG. 6, when an overlay is measured by using a measuring parameter before correction (H-para of (a2) of FIG. 6), a determination coefficient (r-squared, r2) of the graph is 0.82. The correlation coefficient between the overlay offset and the result of the overlay was 0.67. Here, the determination coefficient may indicate the measurement accuracy of the overlay, and the closer to 1, the higher the measurement accuracy.

Thereafter, referring to (b1) of FIG. 6, when an overlay is measured by using a measuring parameter after correction (H-para of (b2) of FIG. 6), the determination coefficient (r2) is 0.89. In addition, the correlation coefficient between the overlay offset and the result of the overlay was 0.89. That is, because the measuring parameter after correction (H-para of (b2) of FIG. 6) on the graph has higher measurement accuracy, the measuring parameter after correction may be determined as a suitable measuring parameter. A measuring parameter improving a correlation coefficient (e.g., a set-get slope) between the overlay offset and the overlay result value may be determined by using a regression analysis method. The consistency of an overlay recipe may be improved by correcting or determining such a measuring parameter.

FIG. 4 is a flowchart illustrating an overlay measuring method according to another embodiment.

Referring to FIGS. 1 and 4, in operation P210, an overlay measuring method generates first measuring values by measuring an overlay on a substrate. Here, a first measuring value may be an overlay value measured by the overlay measuring system 100 of FIG. 1. That is, the first measuring value may represent a measuring value automatically obtained through measuring equipment. Here, the equipment may include the SEM of FIG. 1.

In operation P220, a first image of a contact hole region of the substrate and a second image of an active region of the substrate are obtained based on a cell image of the substrate. In operation P230, second measuring values are generated based on the first image and the second image. Operation P220 may include operation P140 of FIG. 3 of merging the first image with the second image. A second measuring value may be a result value obtained by analyzing and measuring an overlay of an image obtained by merging the first image with the second image. That is, the second measuring value may represent an overlay value obtained by analyzing and processing an image of a cell. Each of the first measuring values and the second measuring values may be a value obtained by subtracting an average value of all offset values in a field of view (FOV) from a one-bit overlay value. Here, one bit refers to a bit on bit-map data. The bit-map data may be data in which shape data, i.e., vector data, is converted through rasterization or the like. Here, the shape data may be data directly used for actual exposure or pixel data.

Figure 7:
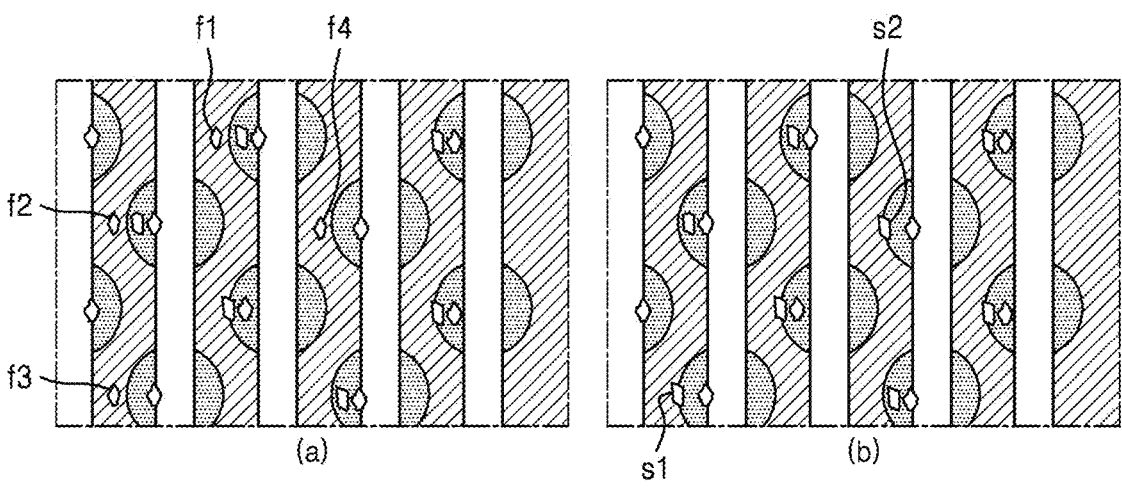
FIG. 7 is a diagram illustrating a method of removing overlay measuring failure values according to embodiments.

FIG. 7 is a diagram illustrating a method of removing overlay measuring failure values according to embodiments.

Referring to FIG. 4 and (a) of FIG. 7, in operation P240, a failure value of the first measuring values is classified based on the first measuring values and the second measuring values. Here, operation P240 may further include calculating a dispersion value of each of the first measuring values and the second measuring values. The dispersion value may be calculated by a three-sigma method. Here, the failure value of the first measuring values may correspond to a value in which the first measuring values exceed four times a dispersion value of the second measuring values.

In embodiments, the failure value of the first measuring value may be obtained by multiplying a first differential value (obtained by subtracting a minimum value of the first measuring values from a maximum value of the first measuring values) by a dispersion value of the first measuring value. The failure value of the first measuring value may be less than a failure value of the second measuring value, which is obtained by multiplying a second differential value (obtained by subtracting a minimum value of the second measuring values from a maximum value of the second measuring values) by a dispersion value of the second measuring value and nine.

In embodiments, when the maximum value of the first measuring values is greater than a value obtained by adding 2 nm to the maximum value of the second measuring values, the maximum value of the first measuring values may be classified as a failure value. In embodiments, when the minimum value of the first measuring values is less than a value obtained by subtracting 2 nm from the minimum value of the second measuring values, the minimum value of the first measuring values may be classified as a failure value.

Referring to FIGS. 4 and 7, in operation P250, the failure value of the first measuring values is replaced with a normal measuring value. In particular, the classified failure value of the first measuring values may be deleted. Next, the classified failure value may be replaced with the second measuring value corresponding to the first measuring value. Here, the second measuring value corresponding to the first measuring value may be estimated by using a relational expression between the first measuring value and the second measuring value. The relational expression may be obtained based on coordinates of the first and second measuring values in the substrate and the overlay offset.

In particular, referring to (a) of FIG. 7, in embodiments, among the first measuring values, a first failure value f1, a second failure value f2, a third failure value f3, and a fourth failure value f4 were classified. The first to fourth failure values f1, f2, f3, and f4 may be values that satisfy any one of the conditions for classifying the failure values. The first to fourth failure values f1, f2, f3, and f4 may be determined according to a predetermined condition to be deleted or replaced with corresponding second measuring values. Referring to (b) of FIG. 7, in embodiments, the first failure value f1 and the second failure value f2 may be deleted. In addition, in embodiments, the third failure value f3 may be replaced with a first replacement value s1, and the fourth failure value f4 may be replaced with a second replacement value s2.

Figure 10:
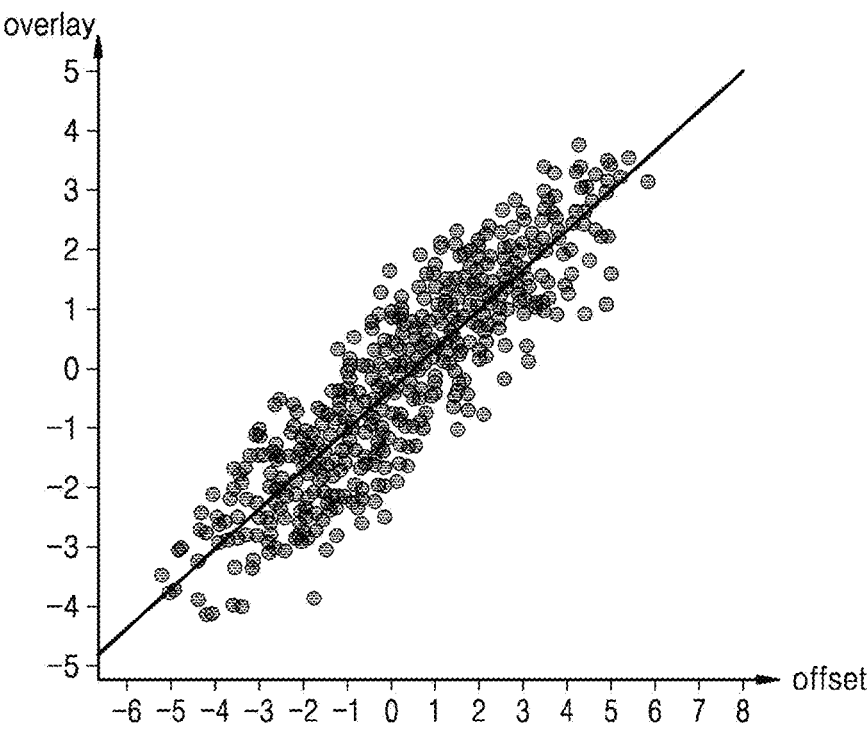
FIG. 10 is a graph illustrating an overlay measuring result according to an embodiment.

FIG. 10 is a graph illustrating an overlay measuring result according to an embodiment.

Referring to FIG. 10, the horizontal axis represents the overlay offset (nm), and the vertical axis represents the overlay result value. The corresponding experimental result is a result of deleting a classified failure value from among the first measuring values or replacing the classified failure value with a corresponding second measuring value. In the graph, a correlation coefficient between the overlay offset and the overlay result value is 1.01, and the determination coefficient has a value of 0.97. As described above, the consistency of the cell overlay may be secured by removing or replacing the first measuring value by using the second measuring value corresponding to an overlay measuring value through image processing.

Figure 11:
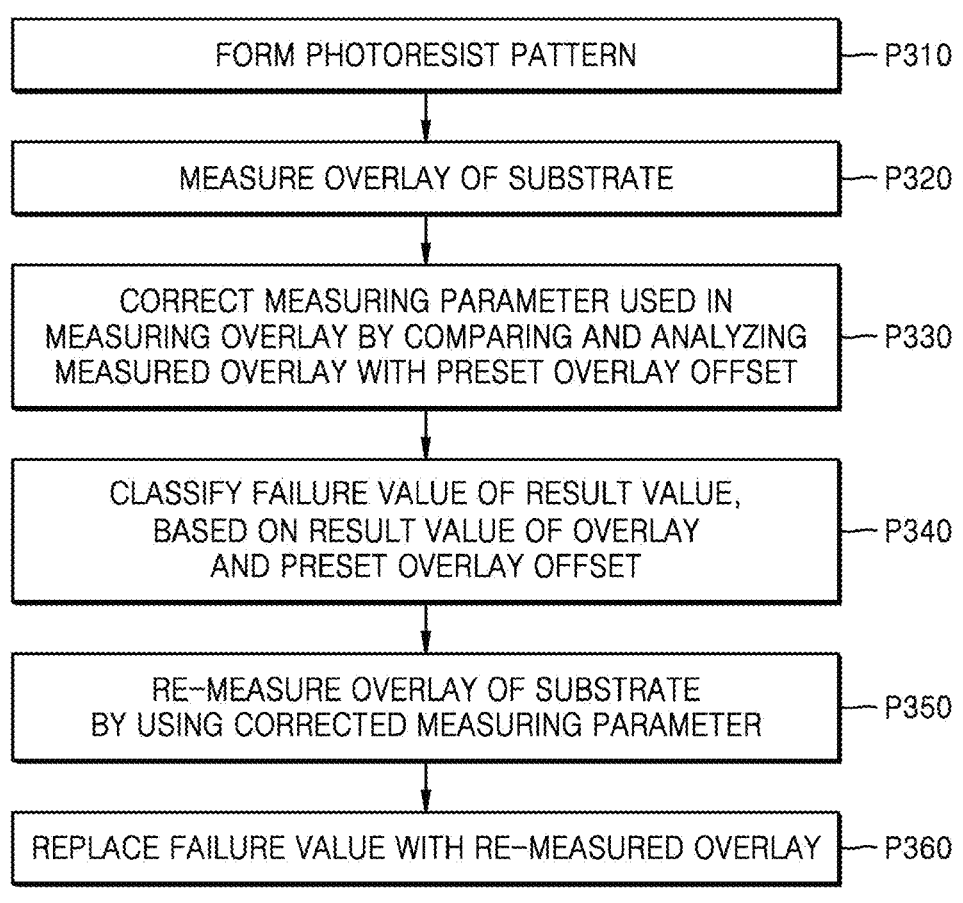
FIG. 11 is a flowchart illustrating an overlay measuring method according to embodiments.

FIG. 11 is a flowchart illustrating an overlay measuring method according to other embodiments.

Referring to FIG. 11, in operation P310, a photoresist pattern may be formed on a substrate having an upper surface extending in first and second directions. To form a photoresist pattern, a photoresist material film may be provided on the substrate. Provision of the photoresist material film may include an adhesion promotion operation and a spin coating operation. The adhesion promotion operation is an operation for adhering a photoresist to the substrate W or an insulating layer and circuit patterns formed on the substrate W.

The photoresist material may have low adhesion to the surface of silicon or a silicon-containing material. Accordingly, before providing the photoresist material on the substrate W, the adhesion promotion operation may be performed on the surface of the substrate W (or the surface of a material layer formed on the substrate W), e.g., the surface of the substrate W may be treated with hexamethyldisilazane (HMDS). As the HMDS may make the surface of the substrate W hydrophobic, the adhesion between the photoresist material and the substrate W may be improved.

The spin coating operation is an operation of providing a photoresist on the substrate W. The photoresist may include an organic polymer. To coat the photoresist on the substrate W, the substrate W provided with the photoresist in a solution state may be spin-rotated at a high speed. A photoresist film having a uniform thickness may be formed by spin rotation of the substrate W.

After the spin coating operation, a soft bake operation may be optionally performed. In some cases, the density of the photoresist film coated on a wafer may be insufficient for subsequent operations. The soft bake operation may densify the photoresist film and remove a solvent remaining on the photoresist film. The soft bake operation may be performed by a bake plate of an exposure device. A wafer subjected to the soft bake operation may optionally be placed on a chill plate and cooled.

The photoresist film may be exposed. An exposure operation of transferring a circuit pattern previously formed in a lithographic mask to the substrate W may be performed. After the exposure operation, a bake operation after exposure may be selectively performed before a development operation is performed. The bake operation, after exposure, may be performed by a bake plate. The bake operation after exposure is an optional operation used to induce increased uniformity of the photoresist film through additional chemical reactions or diffusion of a particular component within the photoresist film.

Then, a development operation may be performed to remove an exposed or unexposed portion of the photoresist. A photoresist pattern may be formed by the development operation. Thereafter, the photoresist pattern may be etched.

FIGS. 12A, 13A, 14A, 15A, 16A, 17A, 18A, and 19A illustrate stages in a method of manufacturing a semiconductor device to be an overlay measuring target, according to embodiments. FIGS. 12B, 13B, 14B, 15B, 16B, 17B, 18B, and 19B are cross-sectional views for explaining operations of a method of manufacturing a semiconductor device. Operation P310 of FIG. 11 is described in detail below. Each of the cross-sectional views is a cross-section taken along lines G-G', H-H', K-K' and L-L' of a corresponding one of the plan views, respectively. At this time, each of lines G-G' and H-H' extends in a second direction parallel to an upper surface of a substrate 300, and each of lines K-K' and L-L' extends in a first direction parallel to the upper surface of the substrate 300 and substantially perpendicular to the second direction.

Figure 12A:
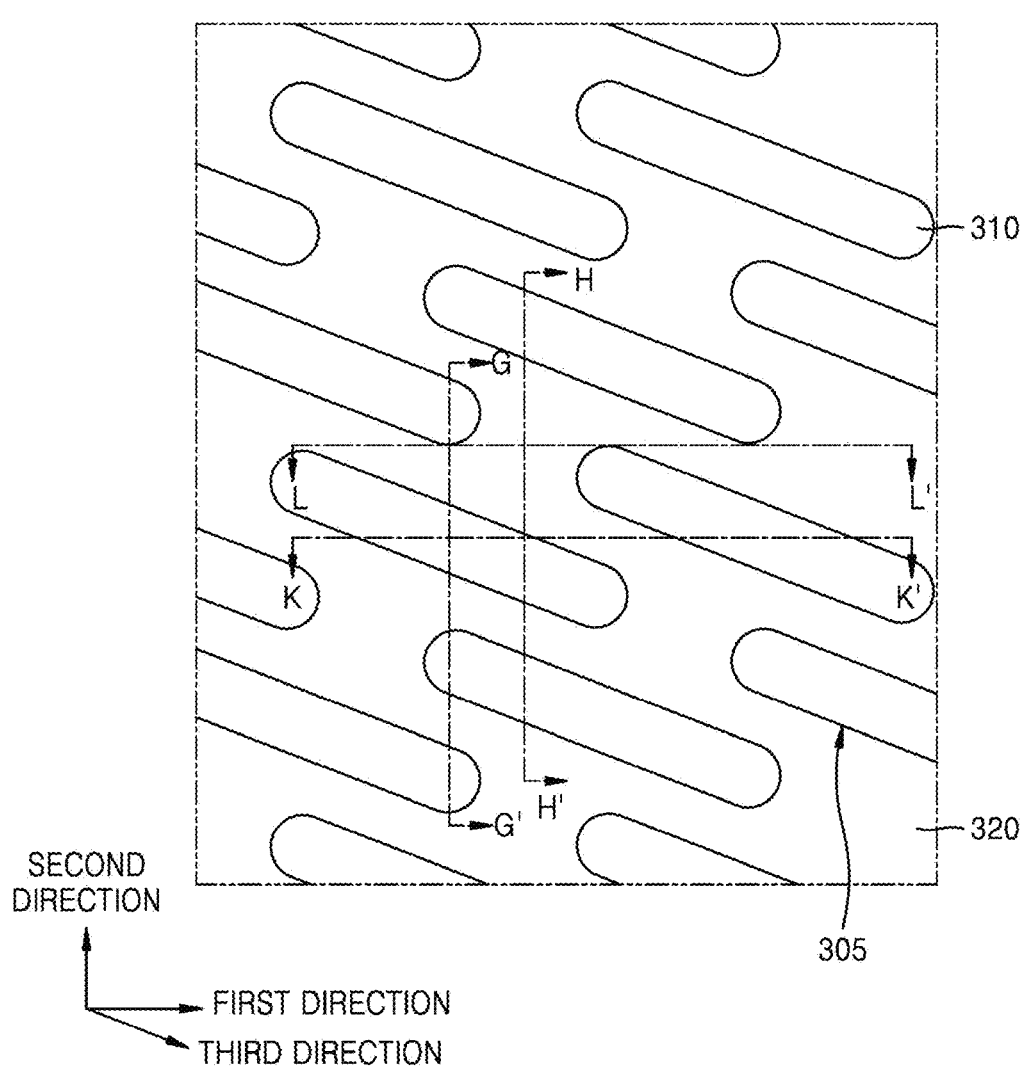
FIGS. 12A, 13A, 14A, 15A, 16A, 17A, 18A, and 19A illustrate stages in a method of manufacturing a semiconductor device to be an overlay measuring target, according to embodiments.
Figure 12B:
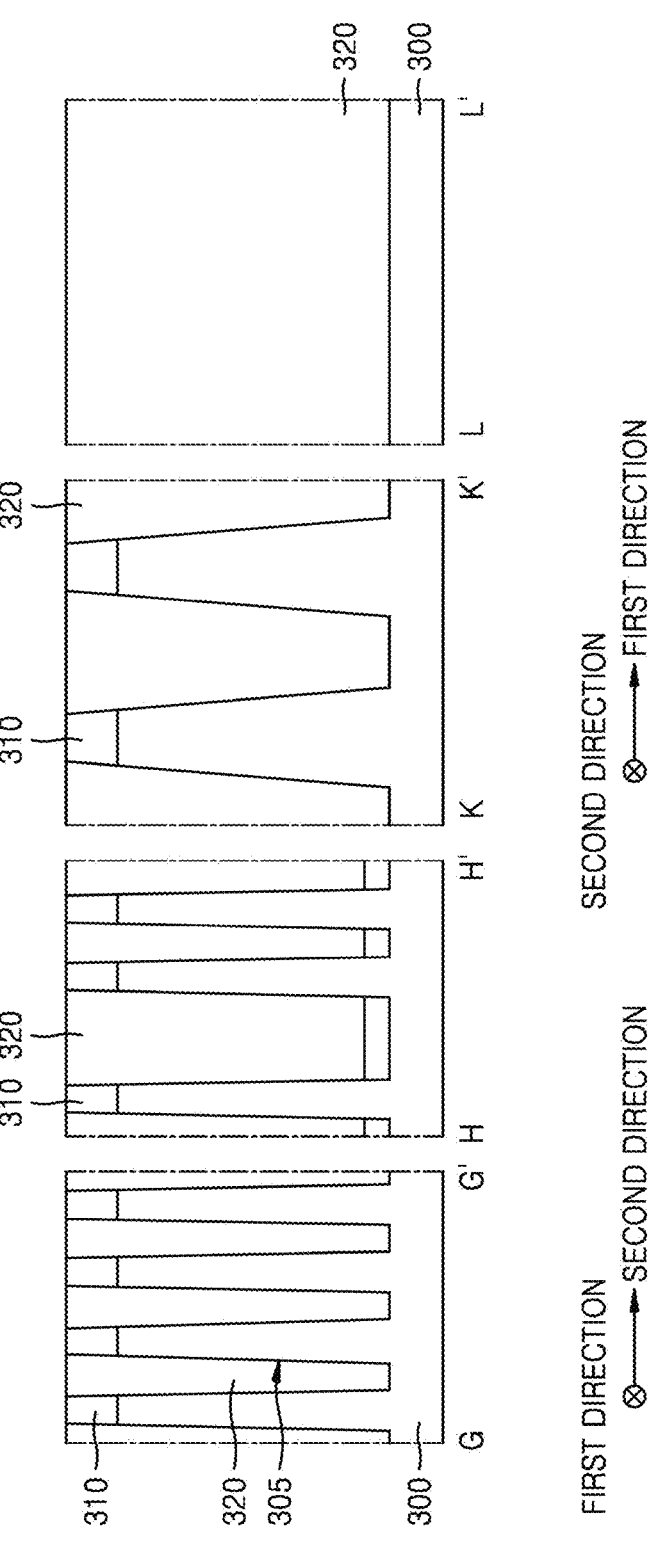
FIGS. 12B, 13B, 14B, 15B, 16B, 17B, 18B, and 19B are cross-sectional views for explaining operations of a method of manufacturing a semiconductor device.

Referring to FIGS. 12A and 12B, a first trench 305 may be formed by forming a first hard mask 310 on the substrate 300 and etching the substrate 300 by using the first hard mask 310 as an etch mask. The substrate 300 may be, e.g., a silicon substrate, a germanium substrate, a silicon-germanium substrate, a silicon-on-insulator (SOI) substrate, a germanium-on-insulator (GOI) substrate, or the like. For example, the first hard mask 310 may be formed to include a nitride, e.g., silicon nitride.

Thereafter, a device isolation film sufficiently filling the first trench 305 may be formed on the substrate 300, and an upper portion of the device isolation film may be planarized until the upper surface of the substrate 300 is exposed, thereby forming a device isolation film pattern 320 inside the first trench 305. For example, the device isolation film may be formed to include an oxide, e.g., silicon oxide.

In the substrate 300, a region in which the device isolation film pattern 320 is formed may be defined as a field region, and a region in which the device isolation film pattern 320 is not formed may be defined as an active region. In embodiments, the active region may be formed in a plurality of isolated shapes, and each active region may extend in a third direction parallel to the upper surface of the substrate 300 but not perpendicular to or not parallel to the first and second directions.

Impurity regions may be formed by doping impurities on the substrate 300. The impurity region may form a transistor together with a first gate structure 360 (refer to FIGS. 16A and 16B) to be formed later. In this case, the impurity regions may serve as source and drain regions of the transistor.

Figure 13A:
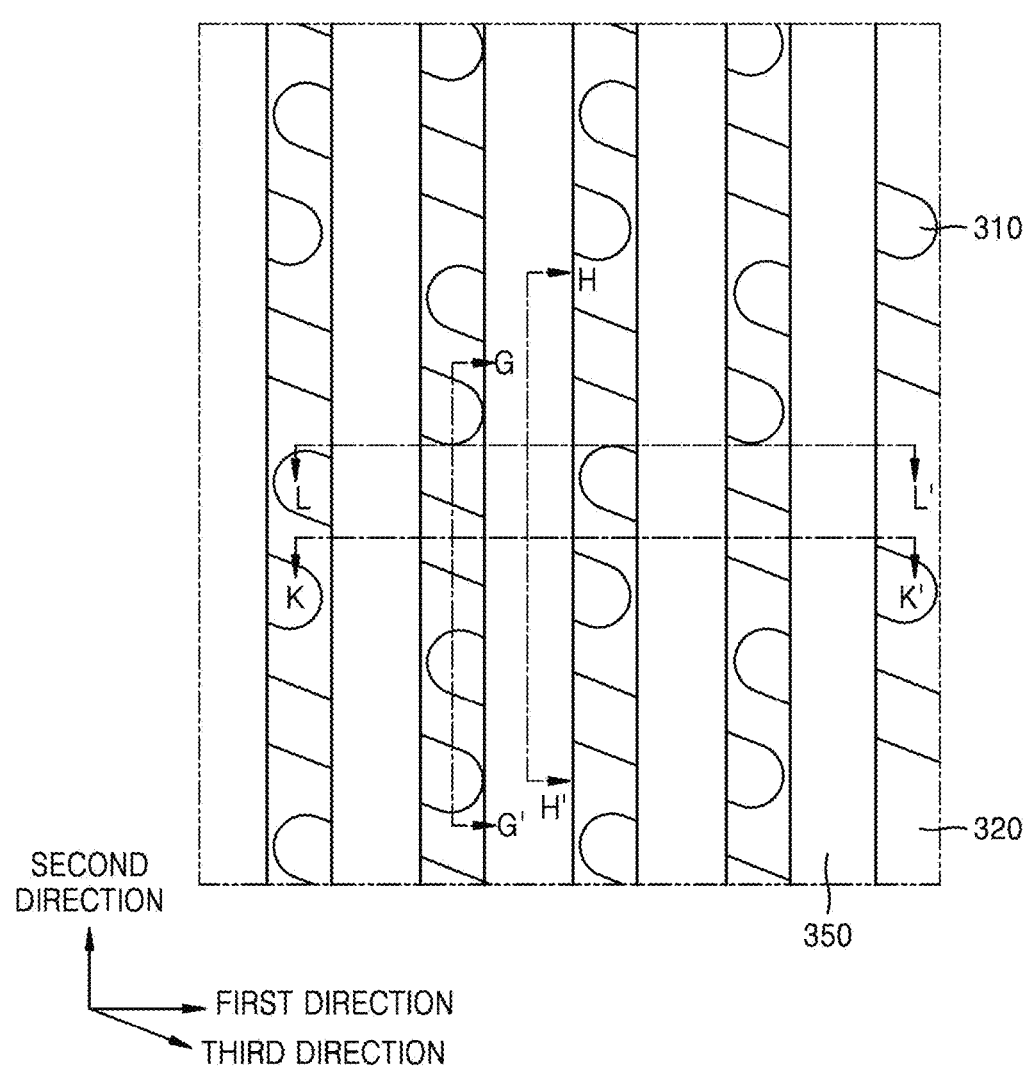
Figure 13B:
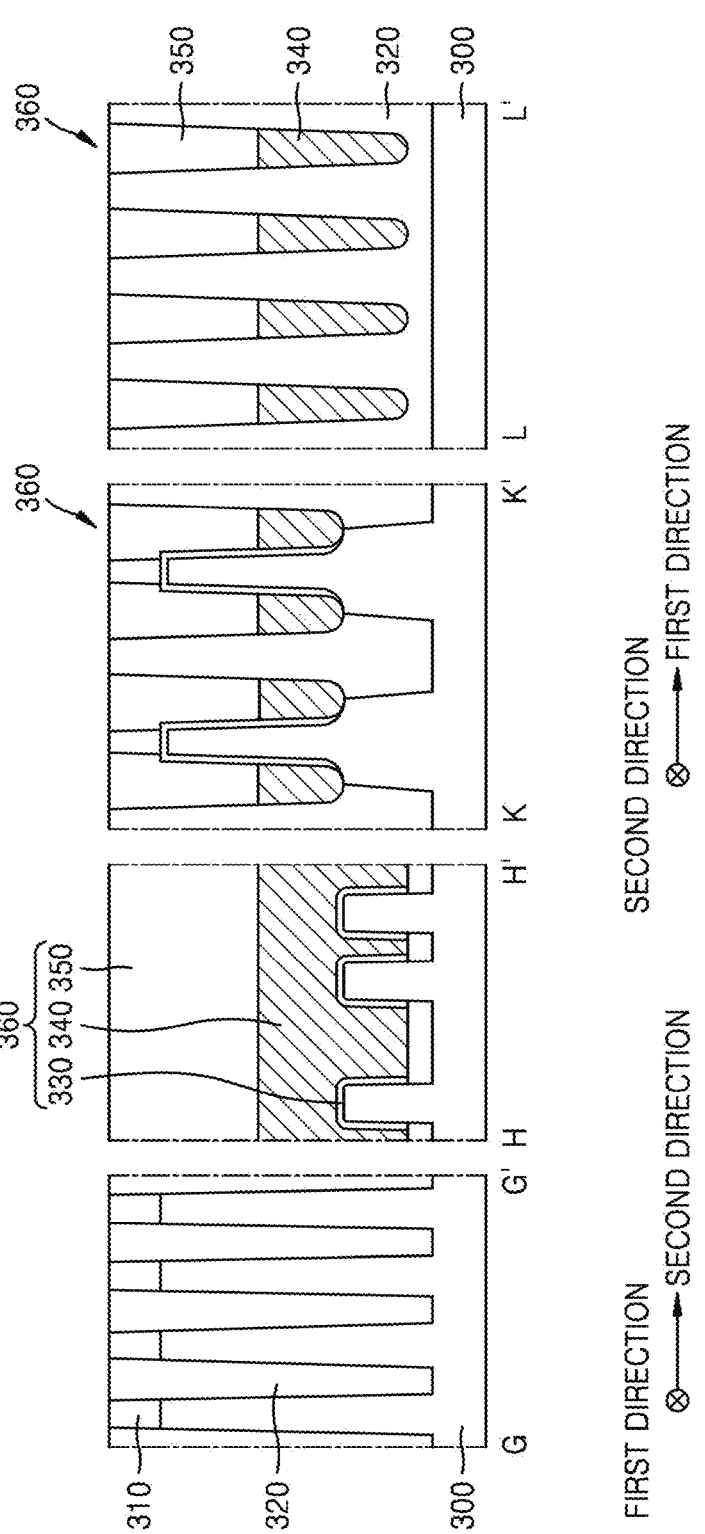

Referring to FIGS. 13A and 13B, the gate structure 360 is formed on the substrate 300 in which the device isolation film pattern 320 is formed.

Second trenches extending in the second direction may be formed by partially etching the first hard mask 310, the substrate 300, and the device isolation film pattern 320. At this time, depending on an etch selectivity between the substrate 300 and the device isolation film pattern 320, the second trenches may be formed to have different depths. In embodiments, two second trenches may be formed in each of the active regions of the substrate 300.

After a gate insulating film 330 is formed on the surface of the substrate 300 in which the second trenches are formed, a gate electrode 340 and a capping film pattern 350 respectively filling lower and upper portions of each of the second trenches may be formed. For example, the gate insulating film 330 may be formed through a thermal oxidation operation or a chemical vapor deposition (CVD) operation, and accordingly, the gate insulating film 330 may be formed to include an oxide, e.g., silicon oxide.

The gate electrode 340 may be formed on the lower portion of each of the second trenches by forming a gate electrode film sufficiently filling the second trenches on the gate insulating film 330, the first hard mask 310, and the device isolation film pattern 320 and then removing an upper portion of the gate electrode film through a chemical mechanical polishing (CMP) operation and/or an etch-back operation. For example, the gate electrode film may be formed to include a metal, e.g., tungsten, titanium, or tantalum, or a metal nitride, e.g., tungsten nitride, titanium nitride, or tantalum nitride.

The capping film pattern 350 may be formed on the upper portion of each of the second trenches by forming a capping film sufficiently filling the second trenches on the gate electrode 340, the gate insulating film 330, the first hard mask 310, and the device isolation film pattern 320 and then planarizing an upper portion of the capping film until upper surfaces of the first hard mask 310 and the device isolation film pattern 320 are exposed. For example, the capping film may be formed to include a nitride, e.g., silicon nitride.

By performing the operation described above, the gate structure 360 including the gate insulating film 330, the gate electrode 340, and the capping film pattern 350 may be formed inside each of the second trenches. In embodiments, the gate structure 360 may extend in the second direction.

Figure 14A:
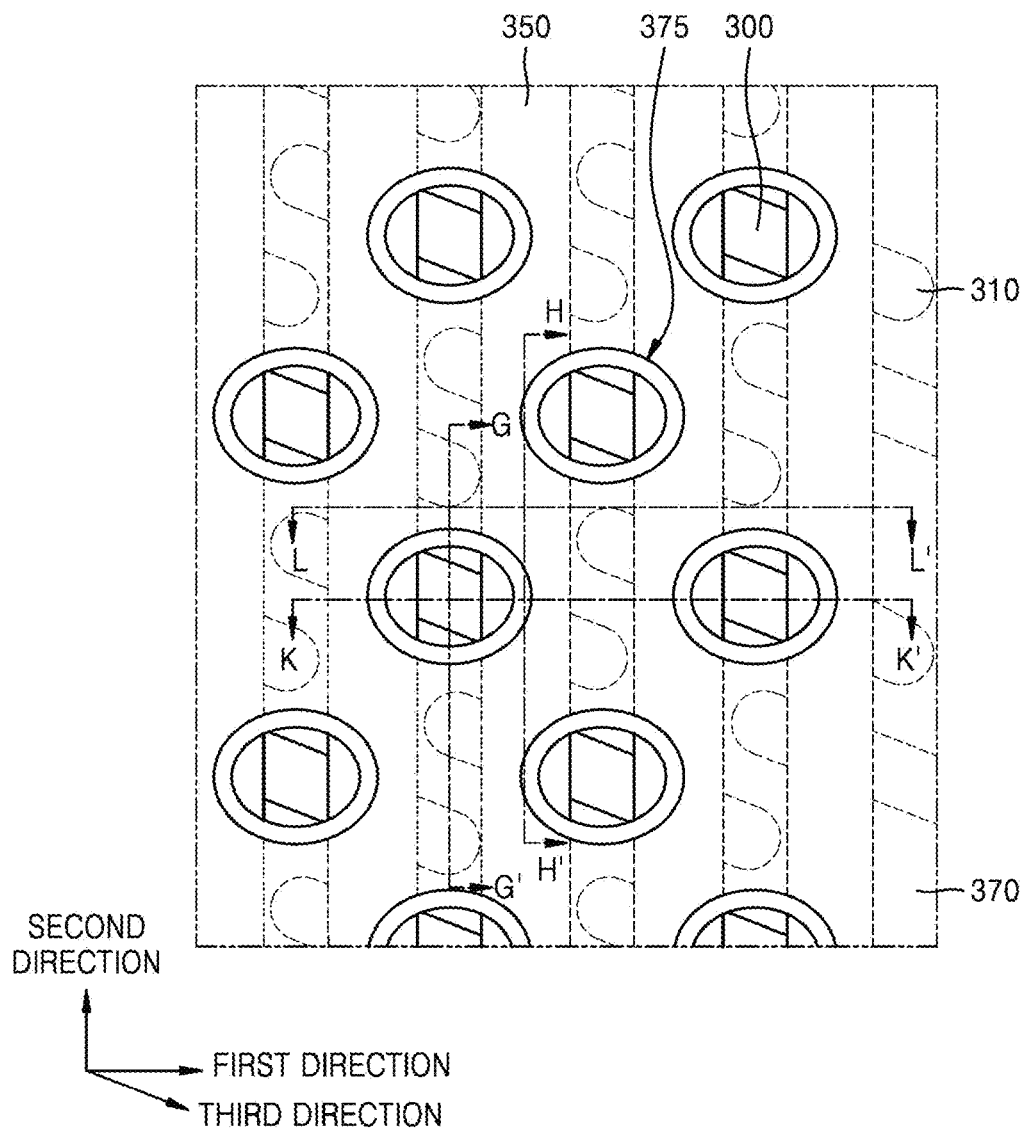
Figure 14B:
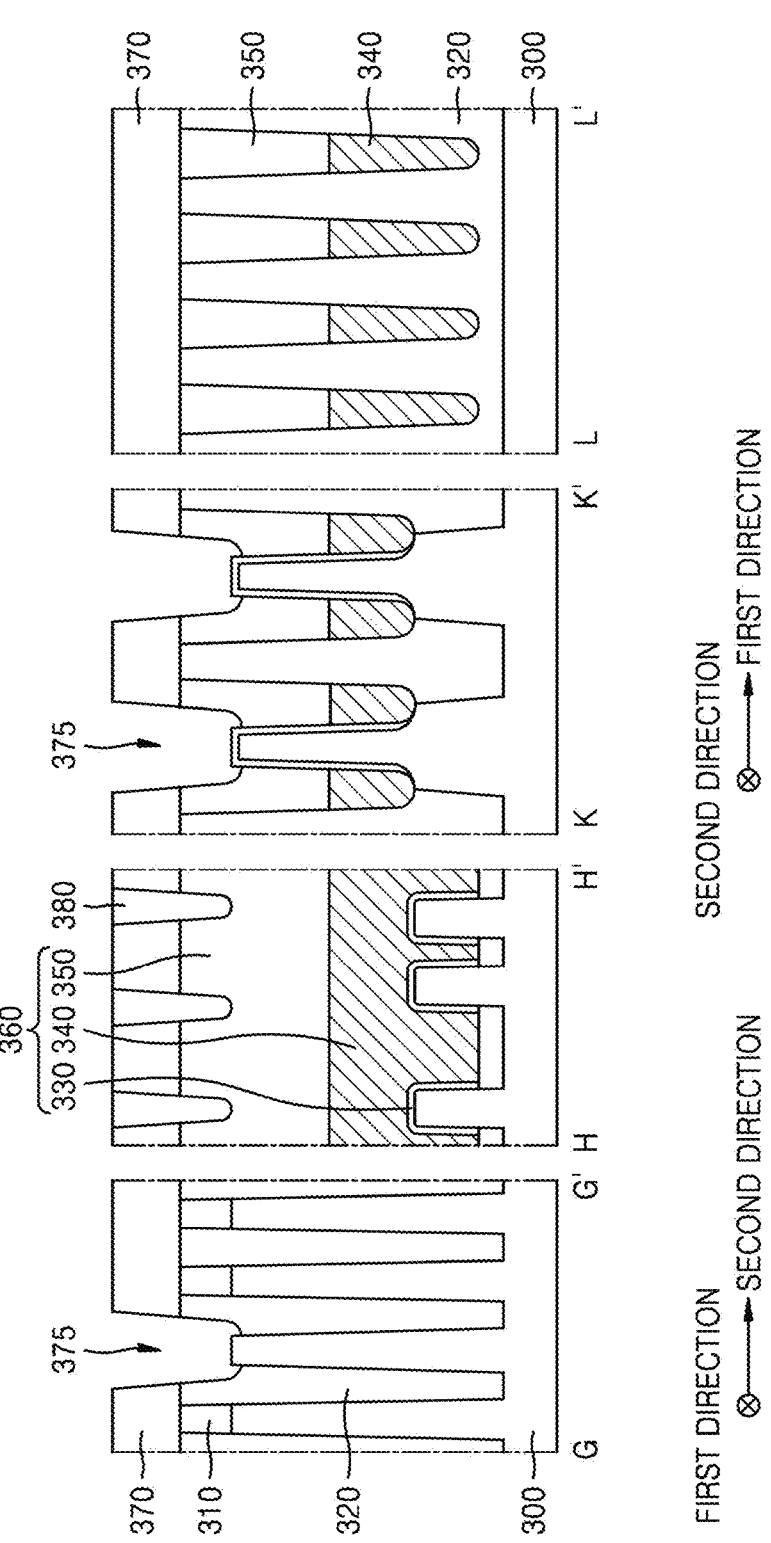

Referring to FIGS. 14A and 14B, after a first interlayer insulating film 370 covering the gate structure 360 is formed on the substrate 300, first contact holes 375 exposing respective active regions (e.g., the fins) of the substrate 300 are formed.

After the first interlayer insulating film 370 is formed on the first hard mask 310, the device isolation film pattern 320, and the capping film pattern 350, the first interlayer insulating film 370 and the first hard mask 310 may be partially etched to form the first contact holes 375 exposing respective active regions of the substrate 300. In embodiments, each of the first contact holes 375 may expose an upper surface of a central portion of each of the active regions. In an operation of forming the first contact hole 375, a portion of the capping film pattern 350 and the device isolation film pattern 320 may also be removed together.

Here, an overlay between the active region (e.g., a lower pattern) of the substrate 300 and the first contact hole 375 (e.g., an upper pattern) may be measured by using the overlay measuring method described with reference to FIGS. 1 to 4 (operations P150 and P320).

Referring to FIGS. 1, 3, and 14A, a cell image of the active region and the first contact hole 375 may be obtained by irradiating a high-acceleration electron beam onto a multi-layered structure of FIG. 14A by using the SEM of FIG. 1 (operation P120). In embodiments, the electro-optical system may use a high-acceleration electron beam having an acceleration voltage of at least 10 kV to detect secondary electrons and backscattered electrons from the multi-layered structure to obtain a cell image simultaneously showing upper and lower structures. Here, the cell image may include an image of the active region, which is a lower pattern, and an image of the first contact hole 375, which is an upper pattern.

Referring to FIG. 3, and 14A and 14B, the first image may correspond to the image of the first contact hole 375, and the second image may correspond to the image of the active region. The overlay of the first contact hole 375 and the active region may be measured in operation P150 described above (e.g., or P320), e.g., the alignment of the first contact hole 375 and the active region underneath may be measured. Next, a measuring parameter may be corrected to improve the consistency between an overlay offset and a result value (e.g., a measured result value) of the overlay (operation P160).

Figure 15A:
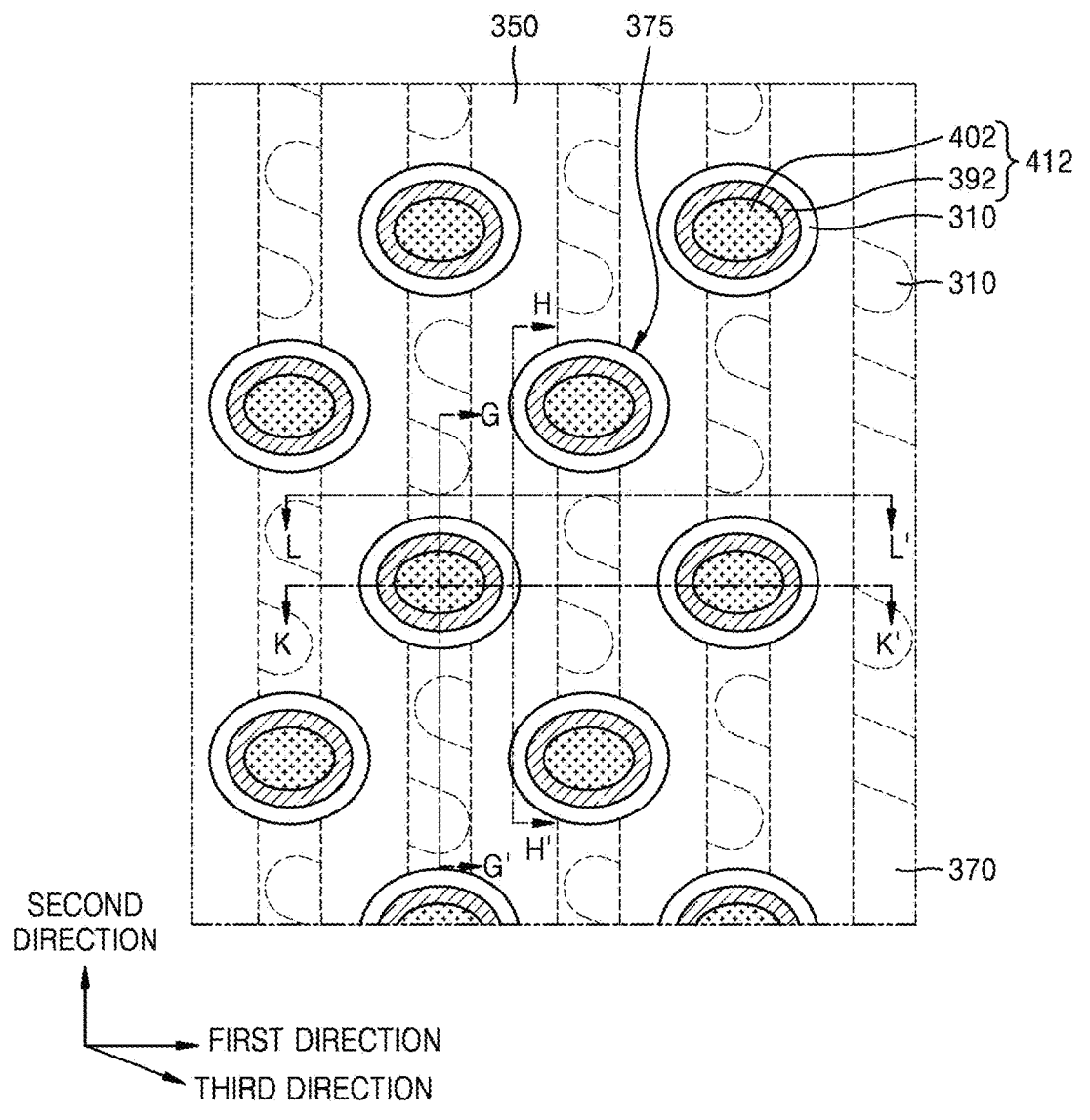
Figure 15B:
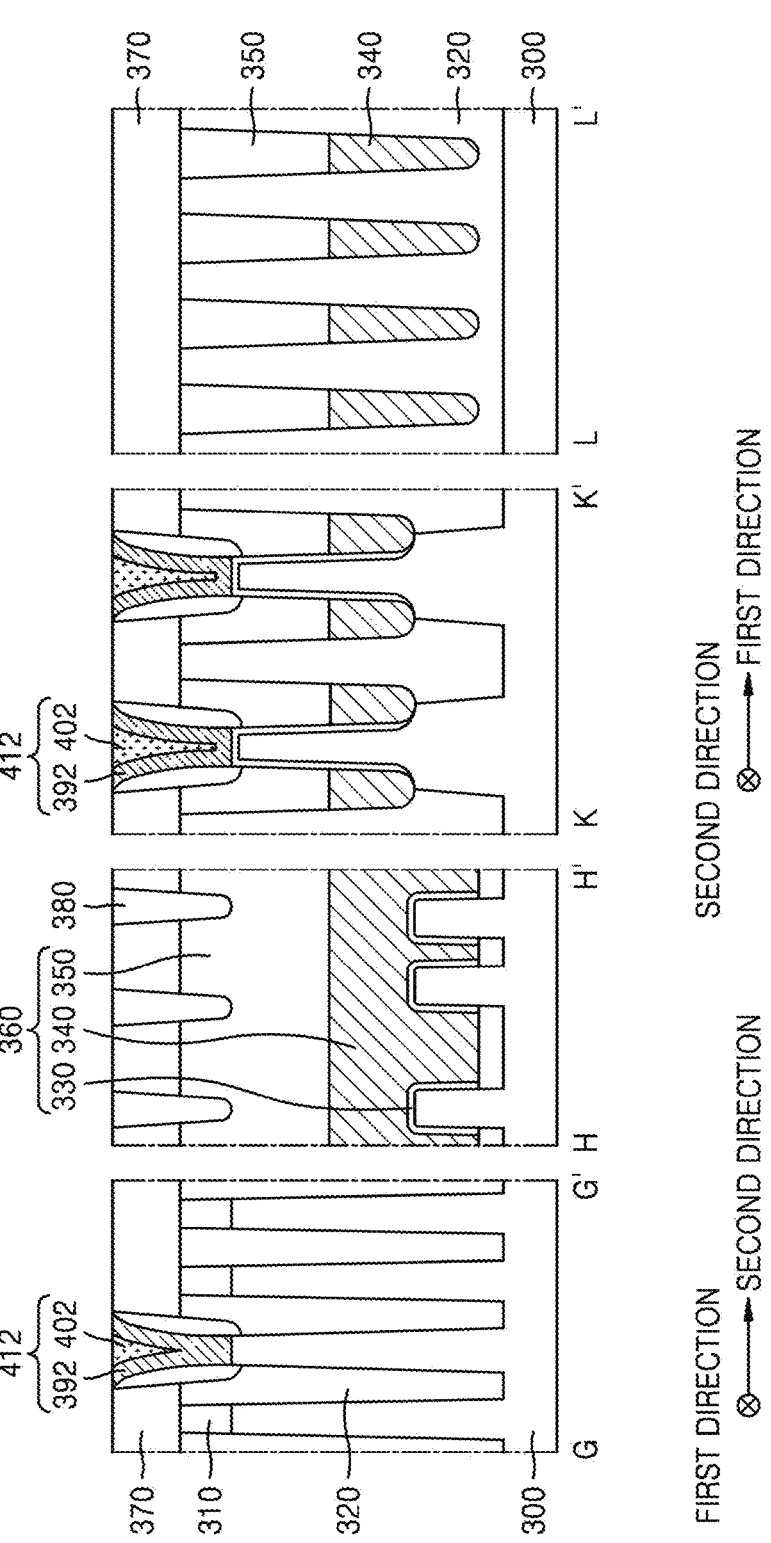

Referring to FIGS. 15A and 15B, first contact plugs 412 filling the first contact holes 375 are formed. First, a first spacer 380 may be formed on a sidewall of each of the first contact holes 375. The first spacers 380 may be formed by forming a first spacer film on the sidewalls of the first contact holes 375, the exposed upper surface of the active region, and the upper surface of the first interlayer insulating film 370, and then anisotropically etching the first spacer film. For example, the first spacer film may be formed by using a nitride, e.g., silicon nitride.

The first contact plug 412 filling the remaining portion of each of the first contact holes 375 is formed on the exposed active region and the first spacer 380. At this time, the first contact plug 412 may include a first metal film pattern 402 and a barrier film pattern 392 surrounding the first metal film pattern 402.

The first contact plugs 412 may be formed by forming a barrier film on the exposed active regions of the substrate 300, the first spacers 380, and the first interlayer insulating film 370, forming a first metal film sufficiently filling the remaining portion of the first contact holes 375, and then planarizing upper portions of the first metal film and the barrier film until the upper surface of the first interlayer insulating film 370 is exposed. For example, the barrier film may be formed to include a metal nitride, e.g., tungsten nitride, titanium nitride, tantalum nitride, or the like, and the first metal film may be formed to include a metal, e.g., tungsten, aluminum, copper, or the like. Alternatively, the first contact plugs 412 filling the first contact holes 375 may be formed by using polysilicon doped with impurities.

Figure 16A:
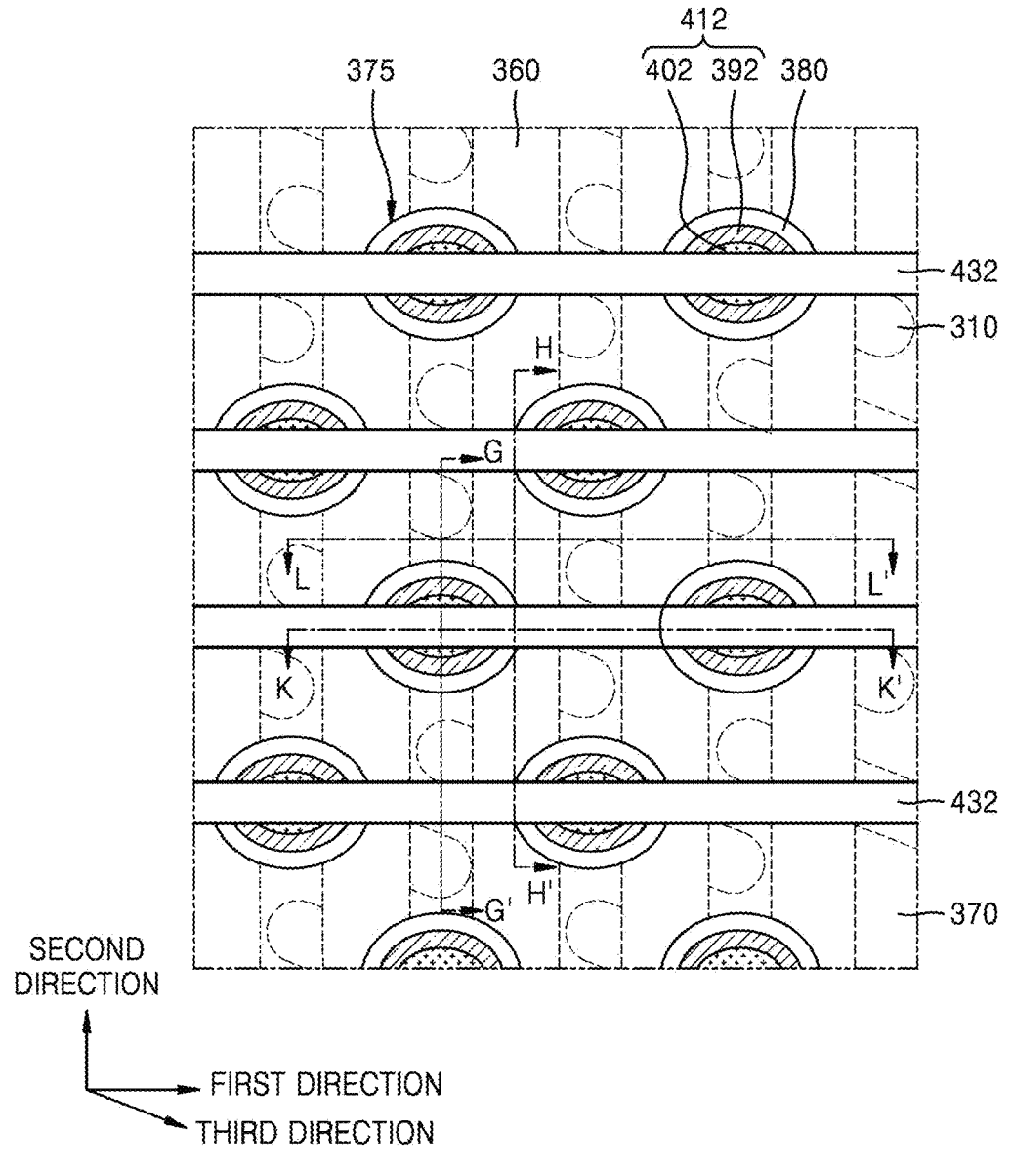
Figure 16B:
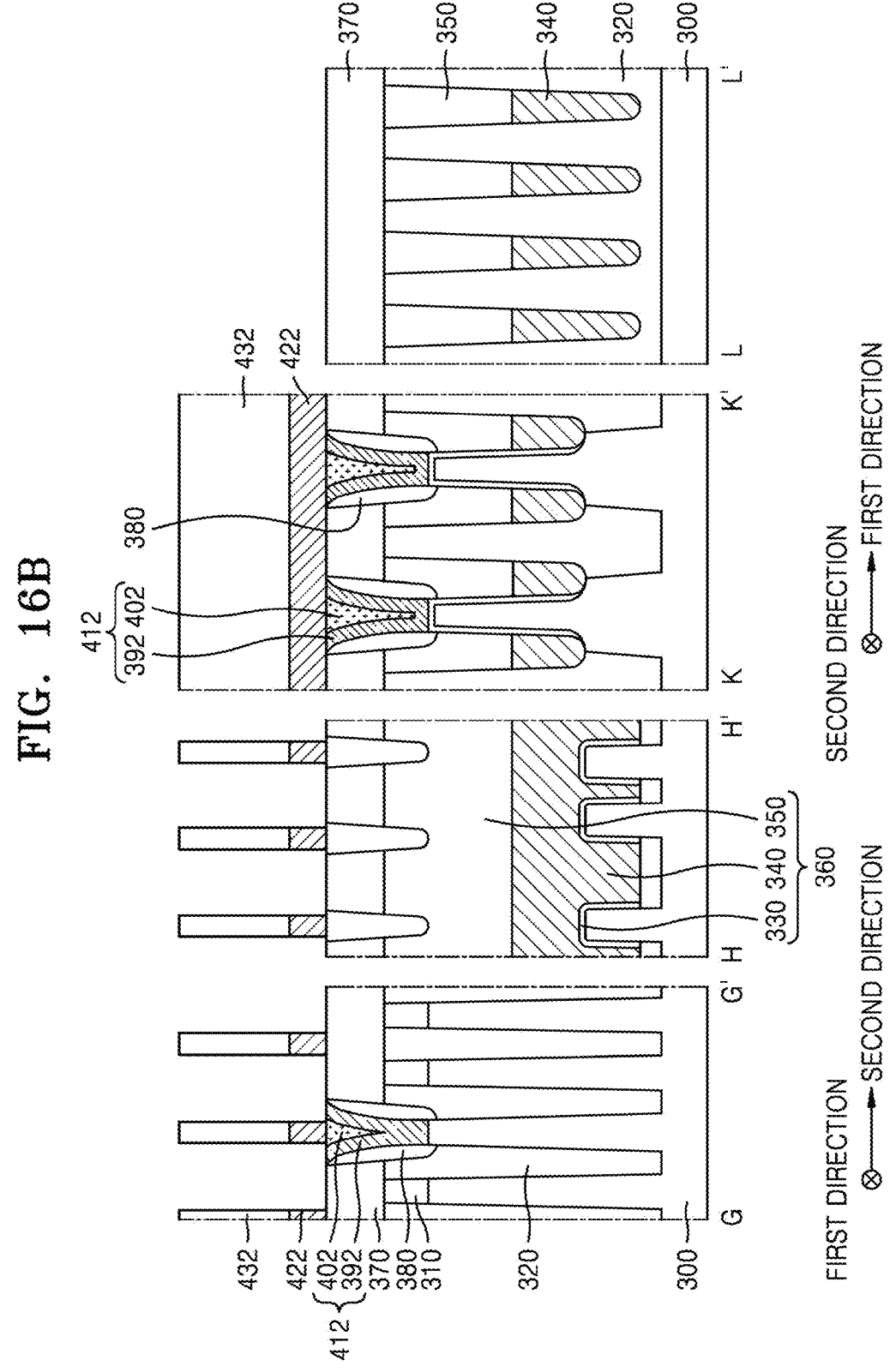

Referring to FIGS. 16A and 16B, a bit line 422 in contact with the first contact plugs, and a second hard mask 432 are formed on the first interlayer insulating film 370.

The bit line 422 and the second hard mask 432 may be formed by sequentially forming a second metal film and a second hard mask film on the first interlayer insulating film 370, the first contact plugs 412, and the first spacers 380, and then patterning the second hard mask film and the second metal film through a photolithography operation. In embodiments, each of the bit line 422 and the second hard mask 432 may extend in the first direction, and may be formed in plurality in the second direction. For example, the second metal film may be formed to include a metal, e.g., tungsten, aluminum, copper, or the like, and the second hard mask film may be formed to include a nitride, e.g., silicon nitride.

Referring to FIGS. 1, 3, and 16A, a cell image of the active region and the bit line 422 may be obtained by irradiating a high-acceleration electron beam on a multi-layered structure of FIG. 16A by using the SEM of FIG. 1 (operation P120). In embodiments, the electro-optical system may use a high-acceleration electron beam having an acceleration voltage of at least 10 kV to detect secondary electrons and backscattered electrons from the multi-layered structure to obtain a cell image simultaneously showing upper and lower structures. Here, the cell image may include an image of the active region, which is a lower pattern, and an image of the bit line 422, which is an upper pattern.

Referring to FIGS. 3 and 11, the first image may correspond to the image of the bit line 422, and the second image may correspond to the image of the active region. An overlay of the bit line 422 and the active region may be measured through operation P150 described above (e.g., or P320). Next, a measuring parameter may be corrected to improve the consistency between the overlay offset and the result value of the overlay (operation P160).

Figure 17A:
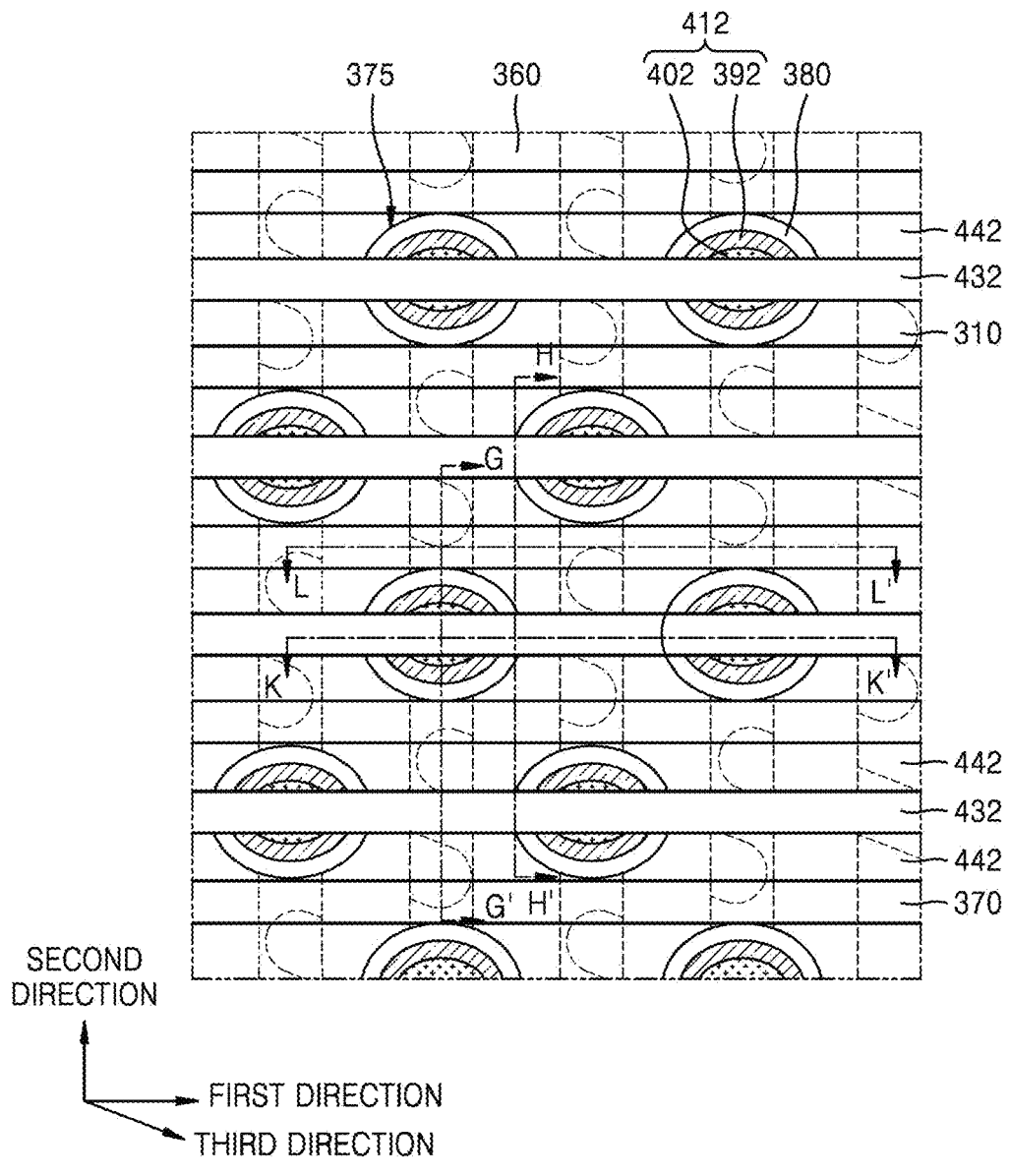
Figure 17B:
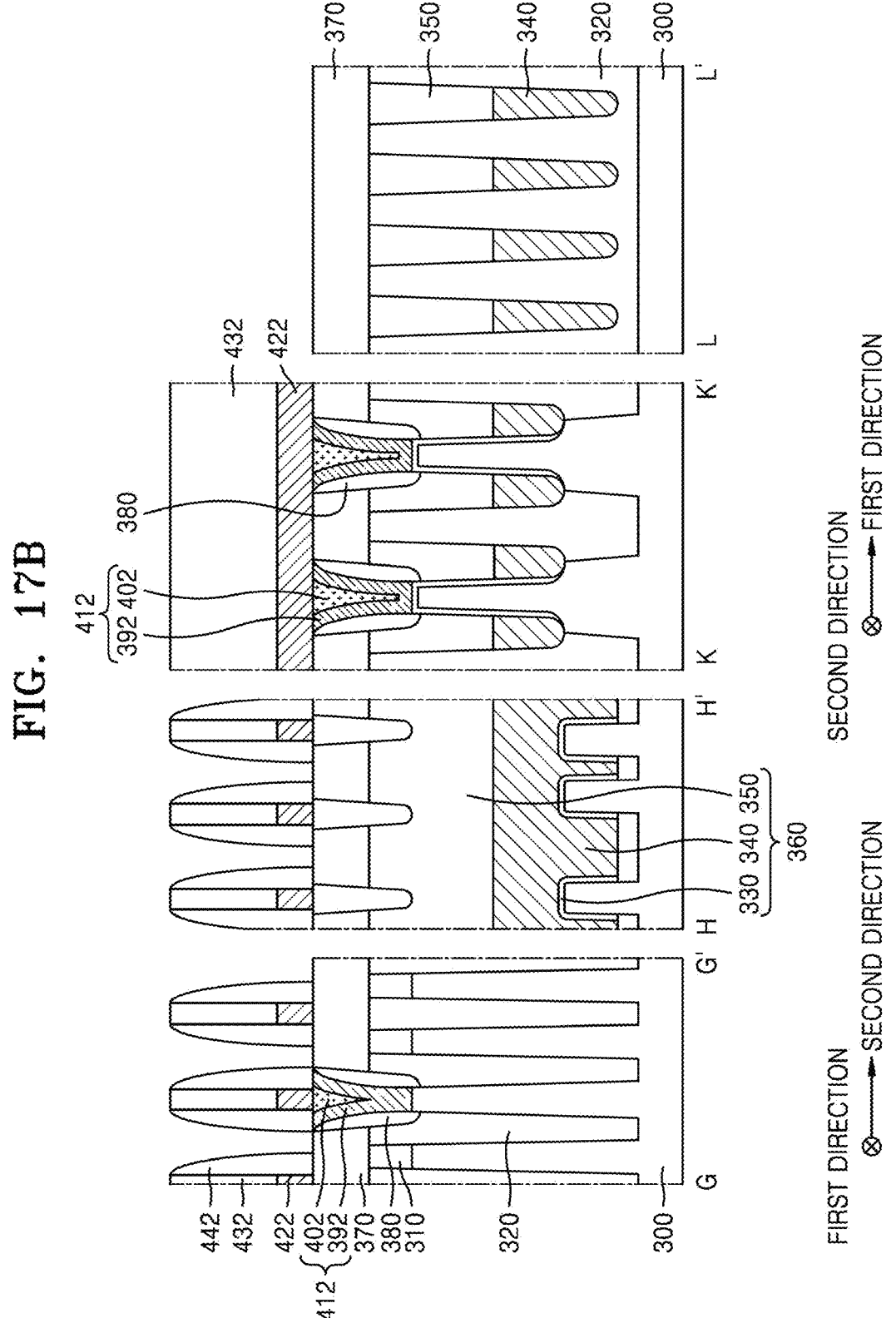

Referring to FIGS. 17A and 17B, a second spacer 442 is formed on a sidewall of each of the bit line 422 and the second hard mask 432.

The second spacers 442 may be formed by forming a second spacer film on the bit lines 422, the second hard masks 432, the first contact plugs 412, and the first interlayer insulating film 370, and then anisotropically etching the second spacer film. For example, the second spacer film may include a nitride, e.g., silicon nitride. In embodiments, the second spacer 442 may extend in the first direction, and may be formed in plurality in the second direction. The bit line 422, the second hard mask 432, and the second spacer 442 may be defined as a bit line structure.

Figure 18A:
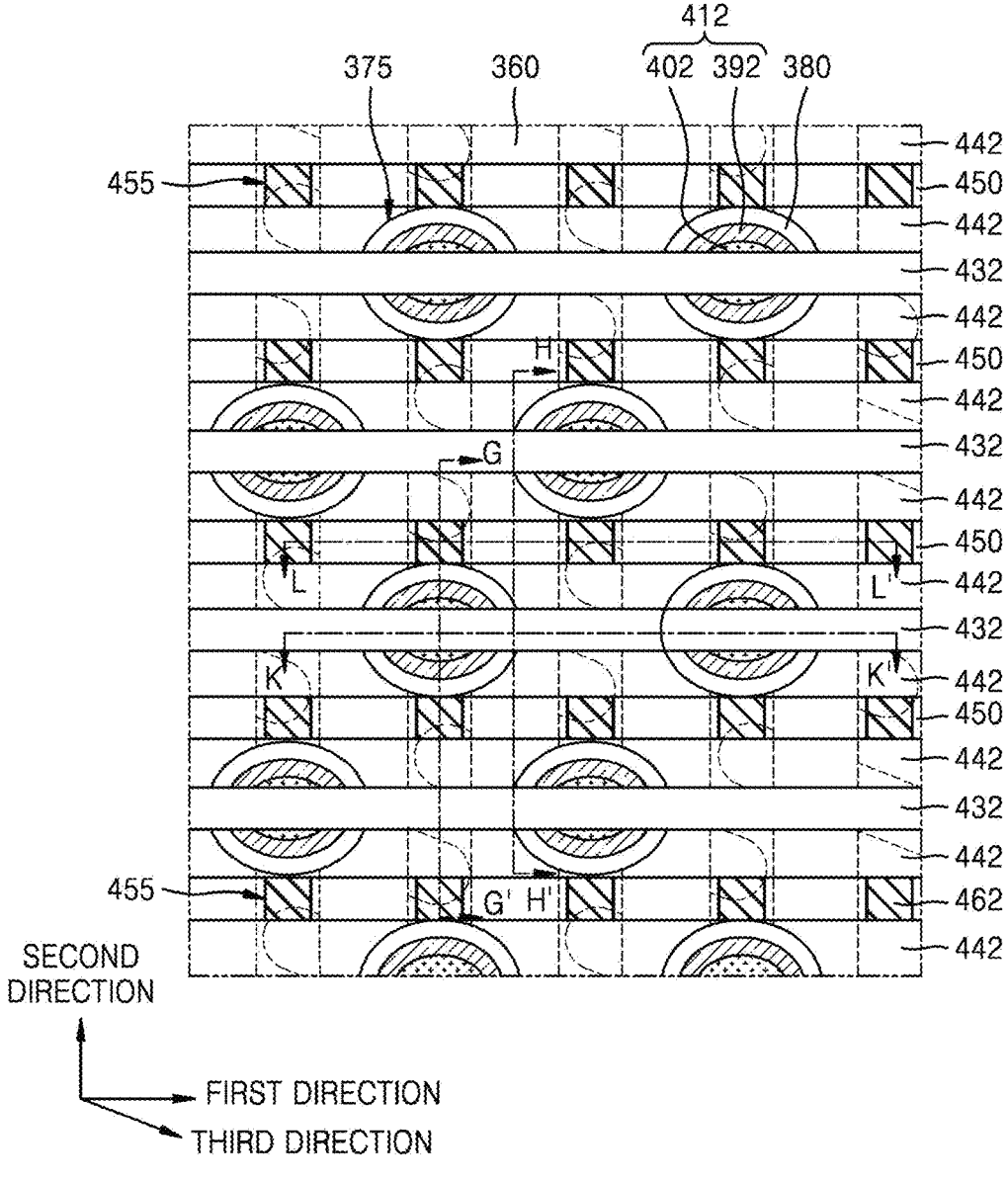
Figure 18B:
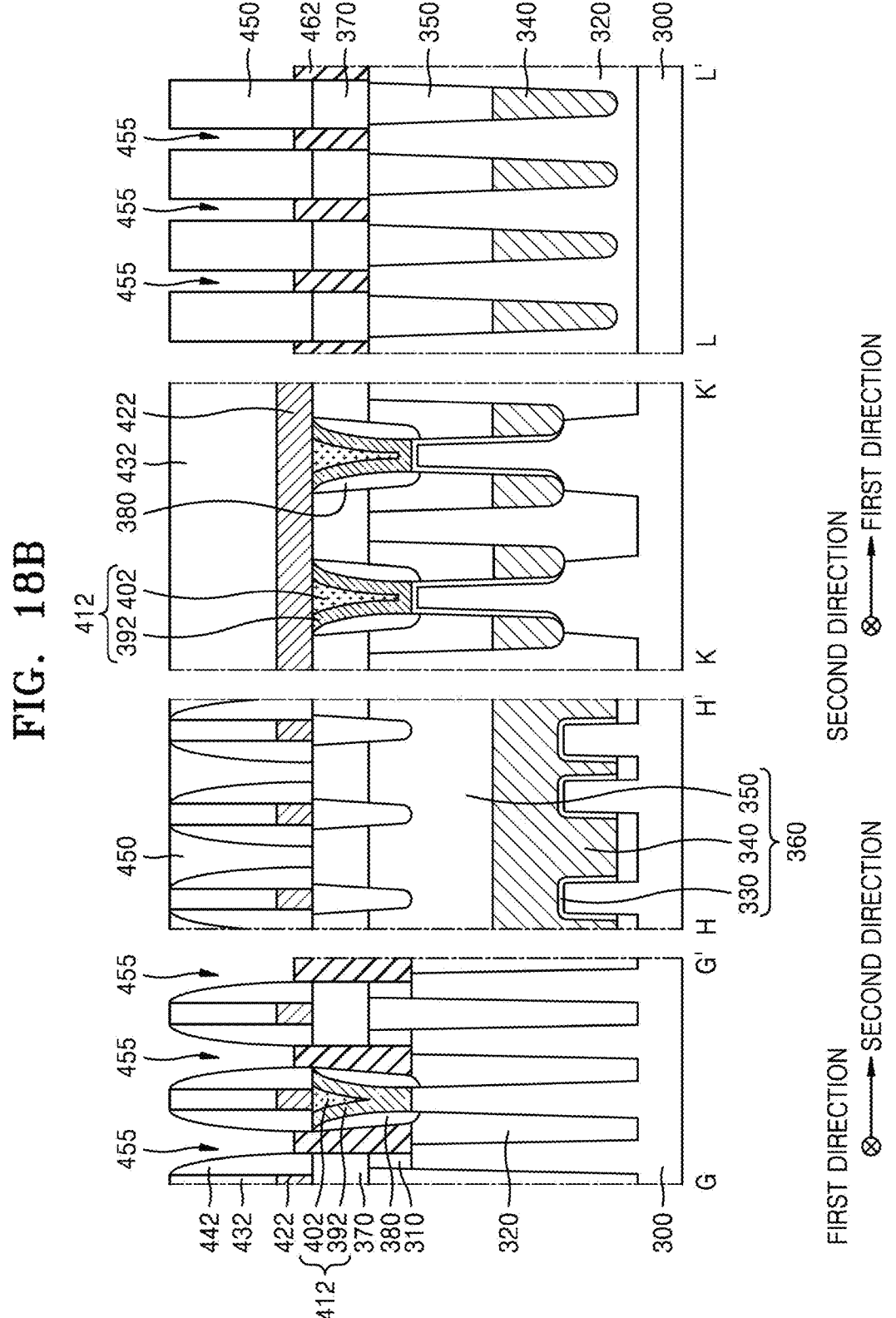

Referring to FIGS. 18A and 18B, after a second interlayer insulating film 450 covering the bit line structures is formed, second contact holes 455 exposing each of the active regions of the substrate 300 are formed. Here, a second contact plug 462 filling a lower portion of each of the second contact holes 455 is formed.

In particular, the second contact holes 455 exposing upper surfaces of respective active regions of the substrate 300 may be formed by forming the second interlayer insulating film 450 covering the bit line structure on the first interlayer insulating film 370 and then partially etching the second interlayer insulating film 450, the first interlayer insulating film 370, and the first hard mask 310. When the second contact holes 455 are formed, a portion of the device isolation film pattern 320 may also be etched together. In embodiments, a plurality of second contact holes 455 may be formed between the bit line structures in the first direction. In embodiments, the second contact holes 455 may be formed to be self-aligned to the bit line structures, and two second contact holes 455 may be formed in each of the active regions.

Thereafter, the second contact plug 462 filling the lower portion of each of the second contact holes 455 may be formed. The second contact plugs 462 may be formed by forming a first conductive film sufficiently filling the second contact holes 455 on the exposed active regions, the bit line structures, and the second interlayer insulating film 450 and then removing an upper portion of the first conductive film. The first conductive film may be formed to include, e.g., polysilicon doped with impurities.

Metal silicide patterns may be further formed on the upper surfaces of the second contact plugs 462. Accordingly, a resistance between the second contact plugs 462 and landing pads 472 subsequently formed may be reduced.

Figure 19A:
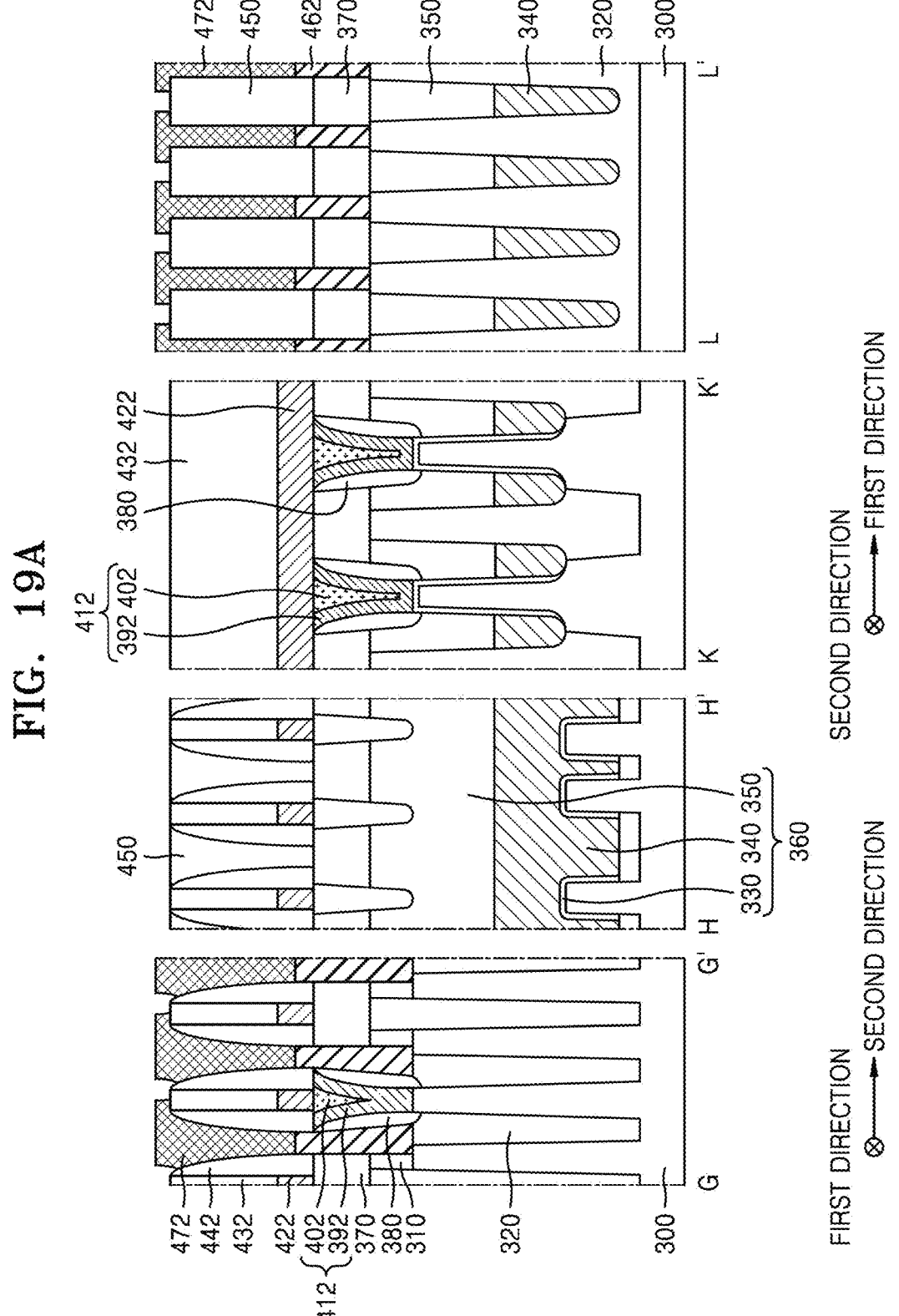
Figure 19B:
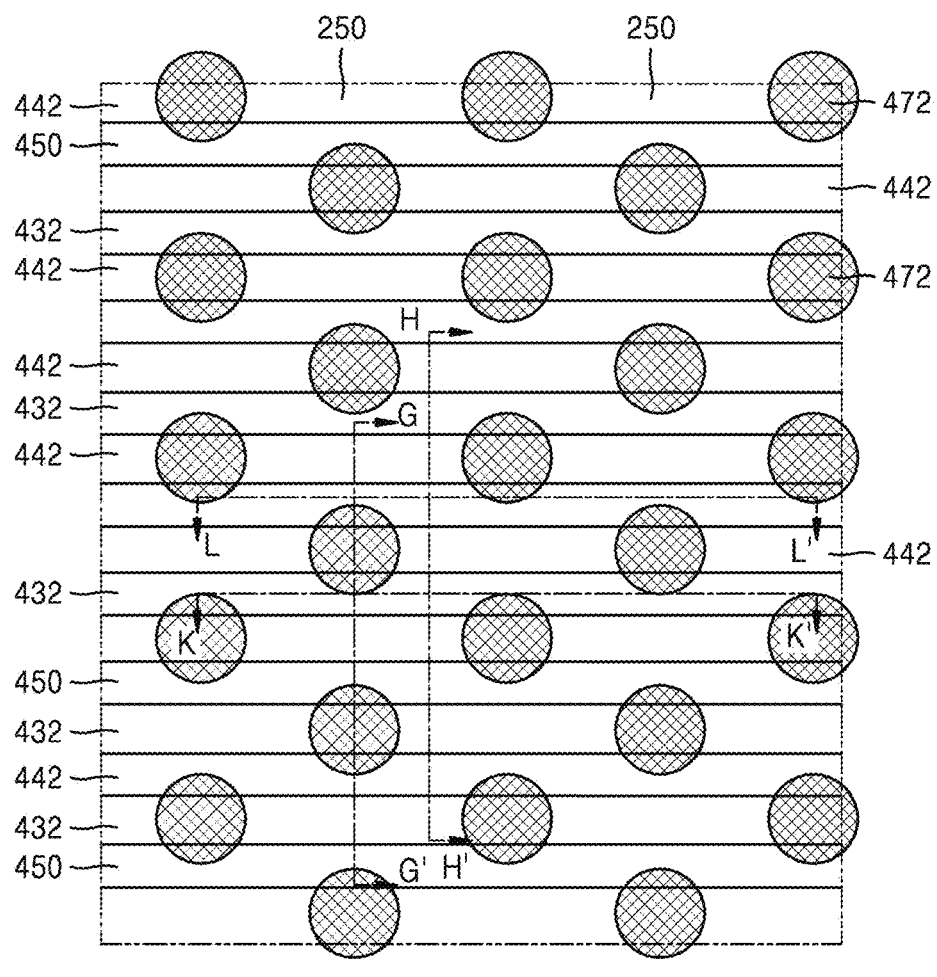

Referring to FIGS. 19A and 19B, the landing pads 472 respectively contacting the upper surfaces of the second contact plugs 462 are formed.

The landing pads 472 may be formed by forming a second conductive film sufficiently filling the remaining portions of the second contact holes 455 on the second contact plugs 462, the bit line structures, and the second interlayer insulating film 450, and then patterning an upper portion of the second conductive film. At this time, lower portions of respective landing pads 472 may contact the upper surfaces of the second contact plugs 462, respectively. For example, the second conductive film may be formed to include a metal, e.g., tungsten, aluminum, copper, or the like.

In embodiments, the landing pads 472 may be formed by patterning the upper portion of the second conductive film by performing a double-patterning operation twice respectively using a first photoresist pattern linearly extending in a fourth direction and a second photoresist pattern linearly extending in a fifth direction. For example, the fourth direction may be substantially parallel to the first direction, and the fifth direction may be perpendicular to or not parallel to the first and second directions.

Referring to FIGS. 1, 3 and 19A, an actual image for the active region and the landing pads 472 may be obtained by irradiating a high-acceleration electron beam onto a multilayered structure of FIG. 16A by using the SEM of FIG. 1 (operation P120). In embodiments, the electro-optical system may use a high-acceleration electron beam having an acceleration voltage of at least 10 kV to detect secondary electrons and backscattered electrons from the multi-layered structure to obtain a cell image simultaneously showing upper and lower structures. Here, the cell image may include an image of the active region, which is a lower pattern, and an image of the landing pads 472, which is an upper pattern.

Referring to FIG. 3, the first image may correspond to the image of the landing pads 472, and the second image may correspond to the image of the active region. An overlay of the landing pads 472 and the active region may be measured through operation P150 described above (e.g., or P320). Next, a measuring parameter may be corrected to improve the consistency between an overlay offset and a result value of the overlay (operation P160).

A measuring parameter used in measuring an overlay may be corrected by comparing and analyzing the measured overlay with a preset overlay offset (operation P330). A failure value of a result value may be classified based on the result value of the overlay and a preset overlay offset (operation P340). Here, correcting of the measuring parameter (operation P330) may be performed in the same manner as described with reference to FIG. 3.

An overlay of a substrate may be re-measured by using the corrected measuring parameter (operation P350). The failure value may be replaced with the re-measured overlay (operation P360). When an overlay of the substrate W is re-measured by using the corrected measuring parameter, the consistency of the overlay offset and the result value of the overlay may be improved. Accordingly, the accuracy and reliability of overlay measurement may be improved.

By way of summation and review, embodiments provide an overlay measuring method capable of precisely measuring an overlay using an actual image of layers (e.g., patterns) in a semiconductor cell. That is, according to embodiments, an overlay measuring method corrects a measuring parameter based on an overlay offset and a result value. In addition, a failure value of the result value of an overlay is classified, and the measuring parameter is corrected in a direction in which the number of failure values is reduced. Accordingly, the overlay measuring method improve consistency of the overlay recipe.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An overlay measuring method comprising:
   providing a substrate that includes an upper pattern on a lower pattern;
   setting an overlay offset on the substrate;
   obtaining a cell image by irradiating an electron beam toward the substrate;
   obtaining a first image of the upper pattern and a second image of the lower pattern, based on the cell image;
   merging the first image with the second image into a merged image;
   measuring an overlay of the merged image; and
   correcting a measuring parameter used in measuring the overlay to improve consistency between the overlay offset and a measured result value of the overlay, the measuring parameter being corrected based on a number of measuring failure values classified as a measurement failure in the measured result value of the overlay.

2. The overlay measuring method as claimed in claim 1, wherein correcting the measuring parameter is performed based on a correlation coefficient between the overlay offset and the measured result value of the overlay.

3. The overlay measuring method as claimed in claim 2, wherein correcting the measuring parameter includes correcting the correlation coefficient to approximate one.

4. The overlay measuring method as claimed in claim 1, wherein each of the measuring failure values is a result value of the overlay of −5 nm or less or the result value of the overlay of 5 nm or more.

5. The overlay measuring method as claimed in claim 1, wherein setting the overlay offset includes using a process window qualification.

6. The overlay measuring method as claimed in claim 5, wherein the overlay offset includes a plurality of overlay values obtained by dividing a value in a range twice a reference offset by 10, each of the plurality of overlay values being set for each of a plurality of shots in the substrate.

7. The overlay measuring method as claimed in claim 6, wherein:

the overlay offset is evenly set for the plurality of shots within six inches of the substrate, and in the plurality of shots, a number of shots set as a first offset, which is one of the plurality of overlay values, is the same as a number of shots set as a second offset, which is another one of the plurality of overlay values.

8. The overlay measuring method as claimed in claim 6, wherein a minimum distance between one of the plurality of shots set to any one of the plurality of overlay values and another of the plurality of shots with a same overlay offset is 1.5 inches.

9. The overlay measuring method as claimed in claim 5, wherein, for the overlay offset, a sum of all offsets set in nine adjacent shots of the plurality of shots is any one of values of −1 nm to 1 nm.

10. The overlay measuring method as claimed in claim 1, wherein the substrate has a scale component of 0.3 nm or less.

11. An overlay measuring method comprising:

providing a substrate that includes a contact hole region on an active region;

generating first measuring values by measuring an overlay of the substrate;

obtaining a first image of the contact hole region of the substrate and a second image of the active region of the substrate, based on a cell image of the substrate;

generating second measuring values based on the first image and the second image;

classifying a failure value of the first measuring values, based on the first measuring values and the second measuring values; and replacing the failure value of the first measuring values with a normal measuring value.

12. The overlay measuring method as claimed in claim 11, wherein each of the first measuring values and the second measuring values is a value obtained by subtracting an average value of all offset values in a field of view from a one-bit overlay value.

13. The overlay measuring method as claimed in claim 12, wherein:

classifying the failure value of the first measuring values includes calculating a dispersion value of each of the first measuring values and the second measuring values, the dispersion value being calculated by a three-sigma method, and the failure value of the first measuring values is a value in which the first measuring values are greater than four times the dispersion value of the second measuring values.

14. The overlay measuring method as claimed in claim 13, wherein the failure value of the first measuring values is obtained by multiplying a first differential value obtained by subtracting a minimum value of the first measuring values from a maximum value of the first measuring values by the dispersion value of the first measuring value, the failure value of the first measuring value being less than a failure value of the second measuring value, which is obtained by multiplying a second differential value obtained by subtracting a minimum value of the second measuring values from a maximum value of the second measuring values by the dispersion value of the second measuring value and nine.

15. The overlay measuring method as claimed in claim 11, wherein a maximum value of the first measuring values is classified as a failure value when the maximum value of the first measuring values is greater than a value obtained by adding 2 nm to a maximum value of the second measuring values.

16. The overlay measuring method as claimed in claim 11, wherein a minimum value of the first measuring values is classified as a failure value when the minimum value of the first measuring values is less than a value obtained by subtracting 2 nm from a minimum value of the second measuring values.

17. The overlay measuring method as claimed in claim 11, wherein replacing the failure value of the first measuring values with the normal measuring values includes deleting the failure value of the first measuring values, and replacing the failure value of the first measuring values with a second measuring value corresponding to the first measuring value.

18. An overlay measuring method comprising:

forming a photoresist pattern on a substrate having an upper surface extending in first and second directions;

measuring an overlay of the substrate;

correcting a measuring parameter used in measuring the overlay by comparing and analyzing the measured overlay with a preset overlay offset;

classifying a failure value of a result value of the overlay, based on the result value of the overlay and the preset overlay offset;

re-measuring an overlay of the substrate by using the corrected measuring parameter; and replacing the failure value with a result value of the re-measured overlay.

19. The overlay measuring method as claimed in claim 18, wherein:

the measuring parameter is corrected so that a result value of the overlay measured with respect to the preset overlay offset is close to 1, and the measuring parameter is re-corrected so that the result value of the overlay has a value ranging from −5 nm to 5 nm.

20. The overlay measuring method as claimed in claim 18, wherein measuring of the overlay of the substrate includes measuring an overlay of an in-cell region of the substrate.

* * * * *